United States Patent
Ogawa et al.

(10) Patent No.: US 7,436,027 B2
(45) Date of Patent: Oct. 14, 2008

(54) SEMICONDUCTOR DEVICE AND FABRICATION METHOD FOR THE SAME

(75) Inventors: Yasuyuki Ogawa, Yamatokoriyama (JP); Yutaka Takafuji, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 13 days.

(21) Appl. No.: 11/646,274

(22) Filed: Dec. 28, 2006

(65) Prior Publication Data

US 2007/0108523 A1    May 17, 2007

Related U.S. Application Data

(62) Division of application No. 10/963,817, filed on Oct. 14, 2004, now Pat. No. 7,205,204.

(30) Foreign Application Priority Data

Oct. 22, 2003 (JP) ............... 2003-361734
Jul. 20, 2004 (JP) ............... 2004-212230

(51) Int. Cl.
H01L 27/01 (2006.01)
H01L 27/12 (2006.01)
H01L 31/0392 (2006.01)

(52) U.S. Cl. ............. 257/347; 257/59; 257/72; 257/352; 438/401

(58) Field of Classification Search ............. 257/59, 257/72, 347, 352; 438/401
See application file for complete search history.

(56) References Cited

U.S. PATENT DOCUMENTS

| | | | |
|---|---|---|---|
| 4,321,747 A | 3/1982 | Takemura et al. | |
| 4,829,018 A | 5/1989 | Wahlstrom | |
| 5,102,819 A | 4/1992 | Matsushita et al. | |
| 5,266,511 A | 11/1993 | Takao | |
| 5,892,256 A | 4/1999 | Matsushita et al. | |
| 6,166,438 A | 12/2000 | Davidson | |
| 6,329,265 B1 * | 12/2001 | Miyawaki et al. | 438/401 |
| 6,355,501 B1 | 3/2002 | Fung et al. | |
| 6,368,936 B1 * | 4/2002 | Yoshida | 438/401 |
| 6,420,791 B1 * | 7/2002 | Huang et al. | 257/797 |

(Continued)

FOREIGN PATENT DOCUMENTS

EP    0 684 643 A1    11/1995

(Continued)

OTHER PUBLICATIONS

U.S. Appl. No. 10/963,817, filed Oct. 14, 2004.

(Continued)

*Primary Examiner*—Zandra Smith
*Assistant Examiner*—Telly D Green
(74) *Attorney, Agent, or Firm*—Nixon & Vanderhye P.C.

(57) ABSTRACT

In a semiconductor device including a monocrystalline thin film transistor 16a that has been formed on a monocrystalline Si wafer 100 and then is transferred to a insulating substrate 2, LOCOS oxidization is performed with respect to the element-isolation region of the monocrystalline Si wafer 100 so as to create a field oxide film (SiO$_2$ film) 104, and a marker 107 is formed on the field oxide film 104. With this structure, alignment of components may be performed based on a gate electrode 106 upon or after the transfer step.

15 Claims, 7 Drawing Sheets

U.S. PATENT DOCUMENTS

| | | | |
|---|---|---|---|
| 7,205,204 | B2 | 4/2007 | Ogawa et al. |
| 2002/0187572 | A1 | 12/2002 | Dai et al. |

FOREIGN PATENT DOCUMENTS

| | | |
|---|---|---|
| GB | 2 300 518 A | 11/1996 |
| JP | 02-060163 | 2/1990 |
| JP | 05-275665 | 10/1993 |
| JP | 2743391 B2 | 2/1998 |
| JP | 11-024106 | 1/1999 |
| JP | 3141486 B2 | 12/2000 |
| JP | 3278944 B2 | 2/2002 |
| JP | 2002-244587 | 8/2002 |
| JP | 2003-031780 | 1/2003 |
| JP | 2003-282885 | 10/2003 |
| WO | 95/09438 | 4/1995 |

OTHER PUBLICATIONS

European Search Report mailed Mar. 15, 2006 in corresponding EP application No. 04256543.2.

"IR Alignment of Two or More Opaque Silicon Wafers", IBM Technical Disclosure Bulletin, IBM Corp., New York, vol. 22, No. 2, Jul. 1979, pp. 841-843.

* cited by examiner

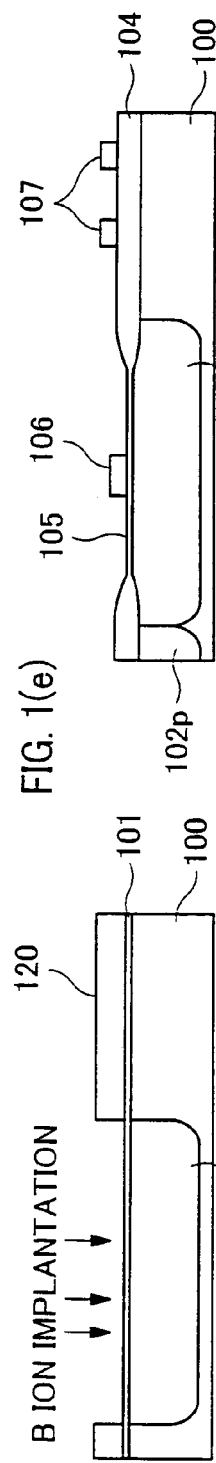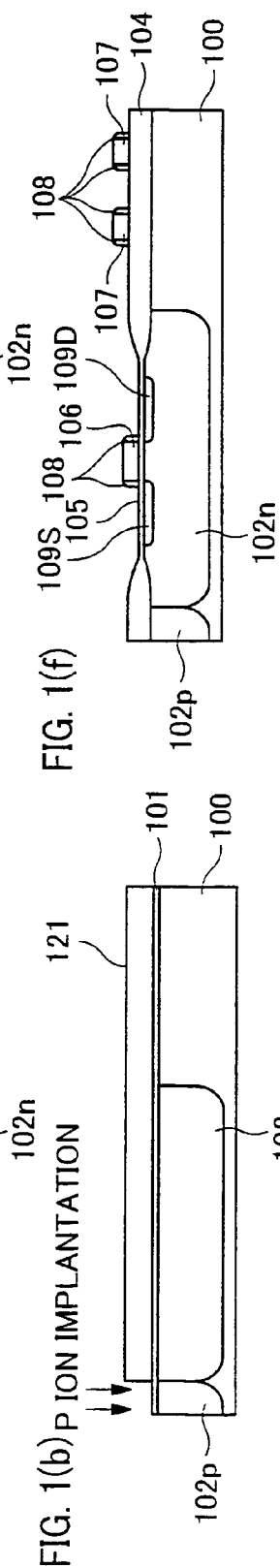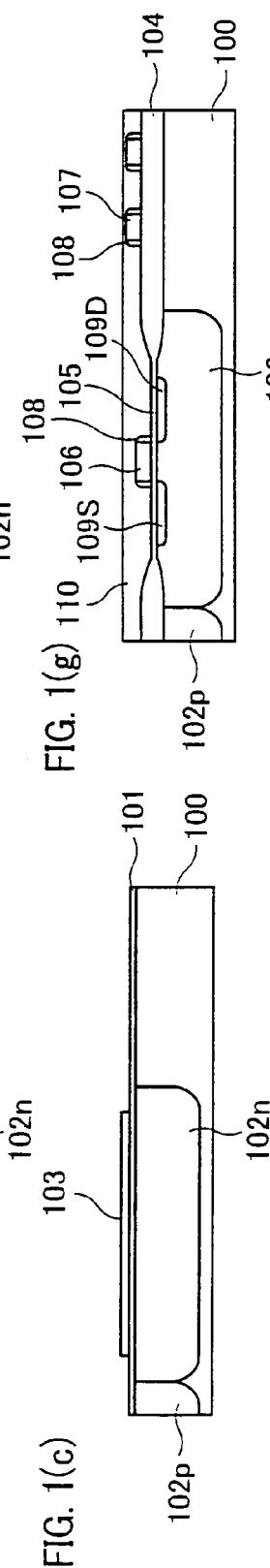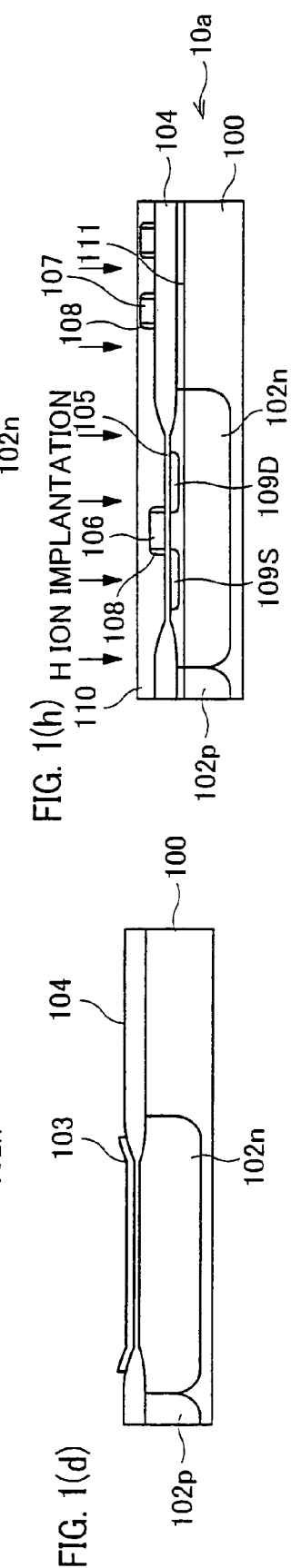

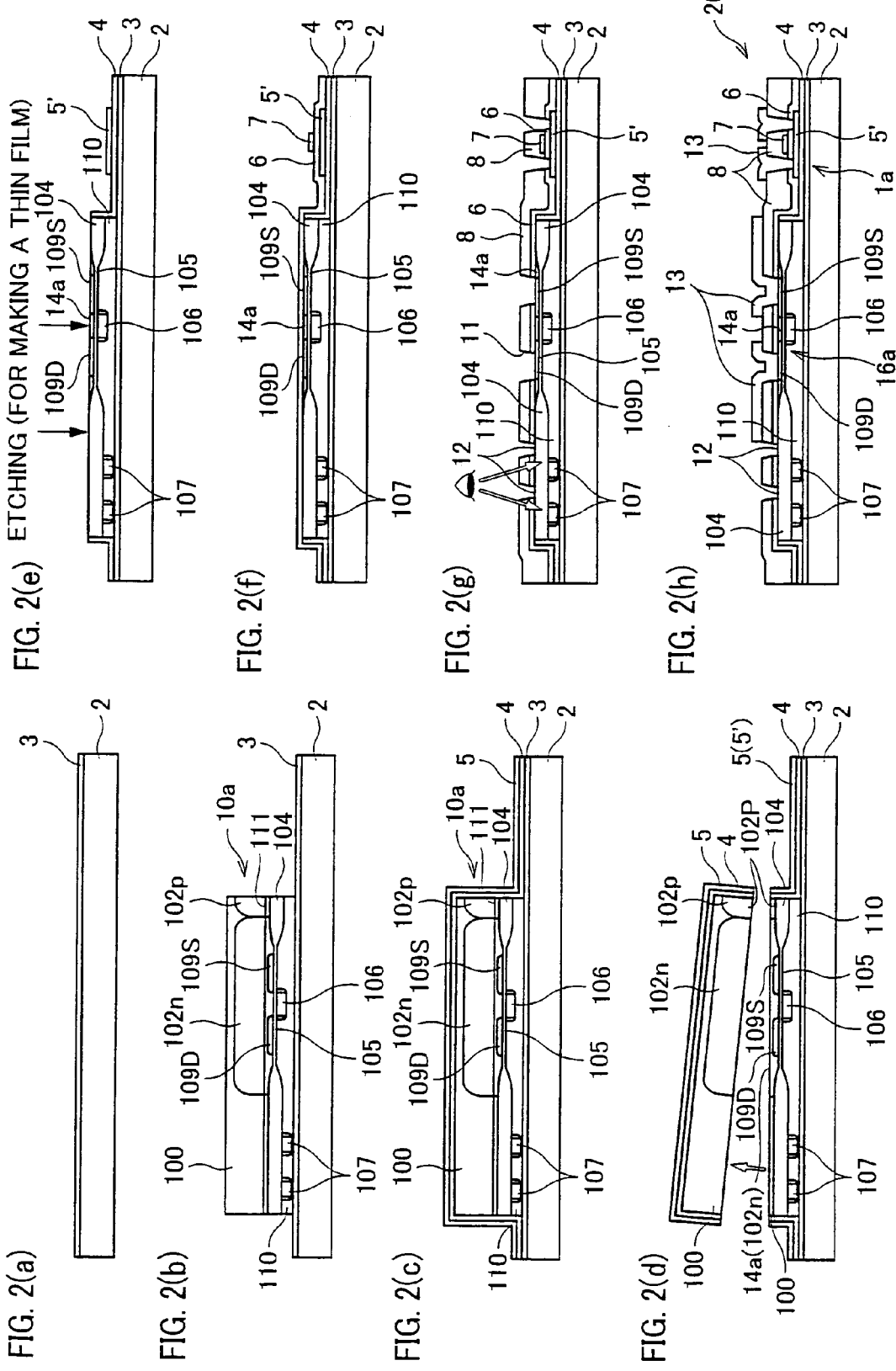

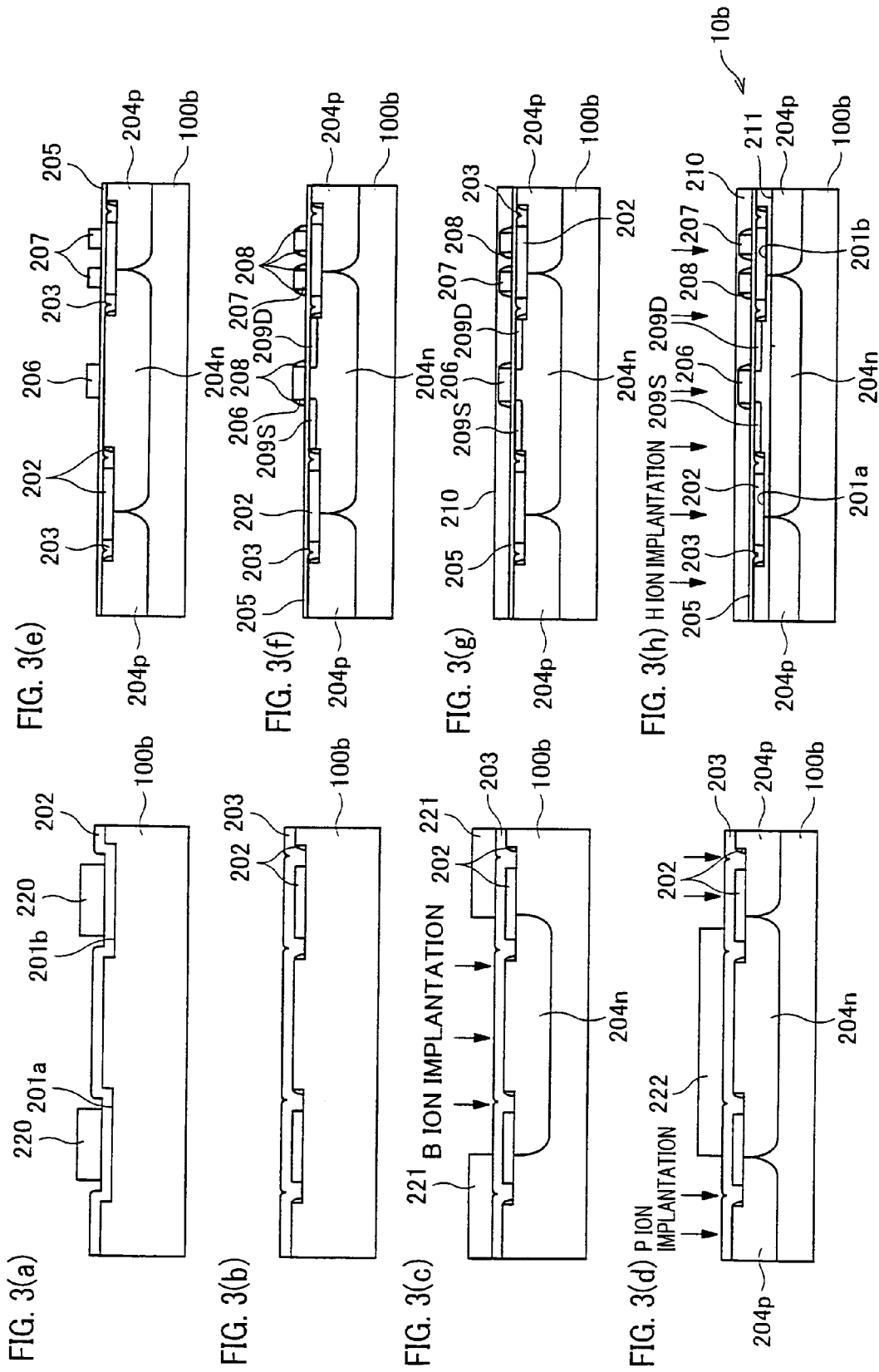

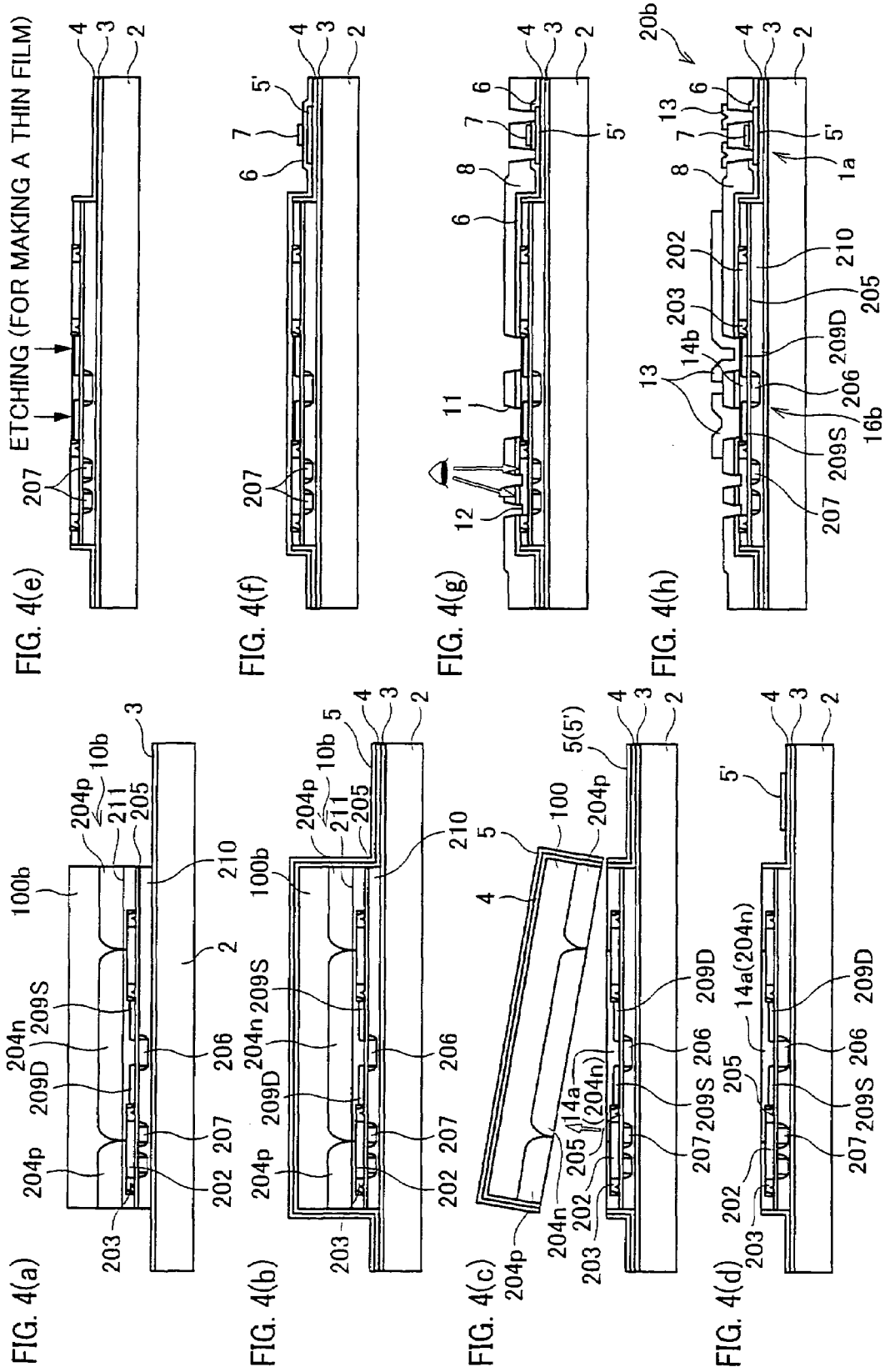

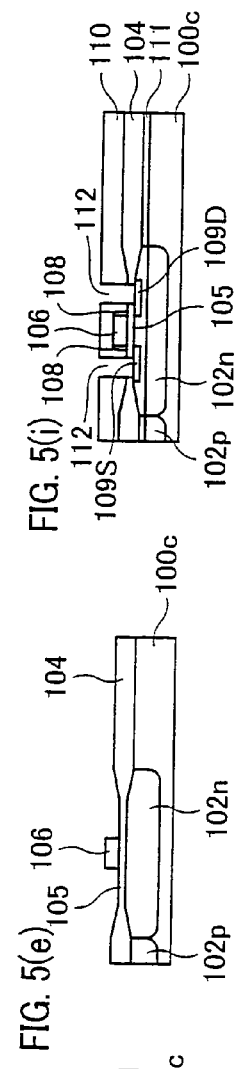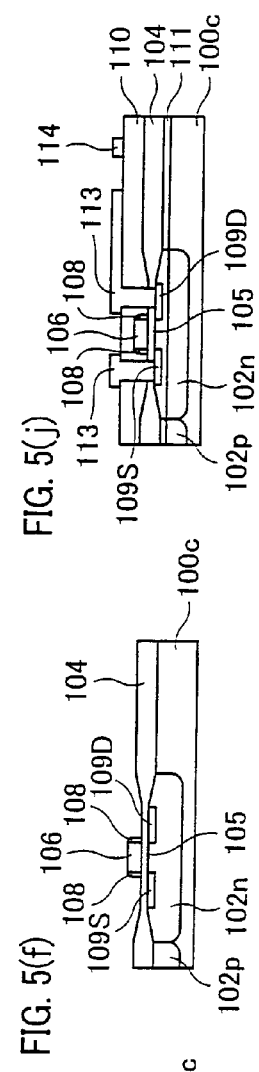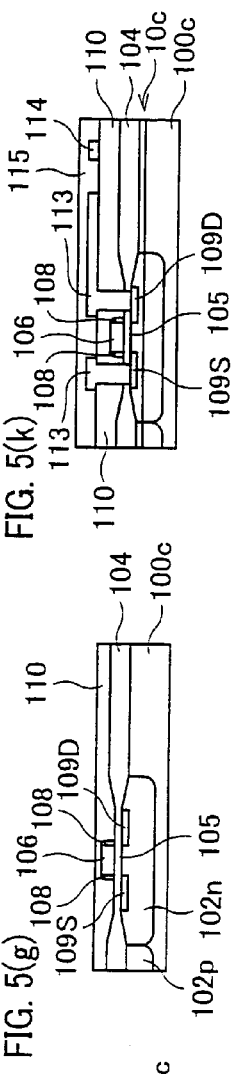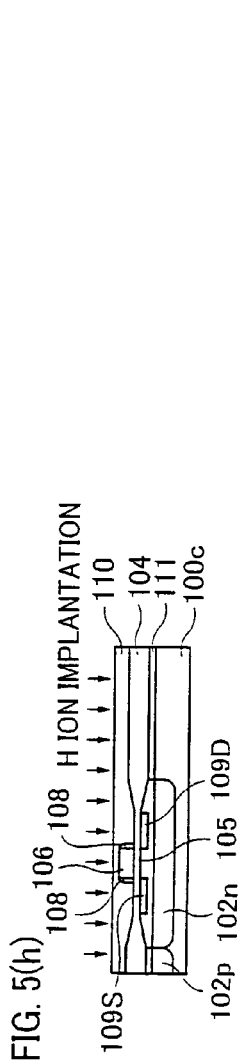

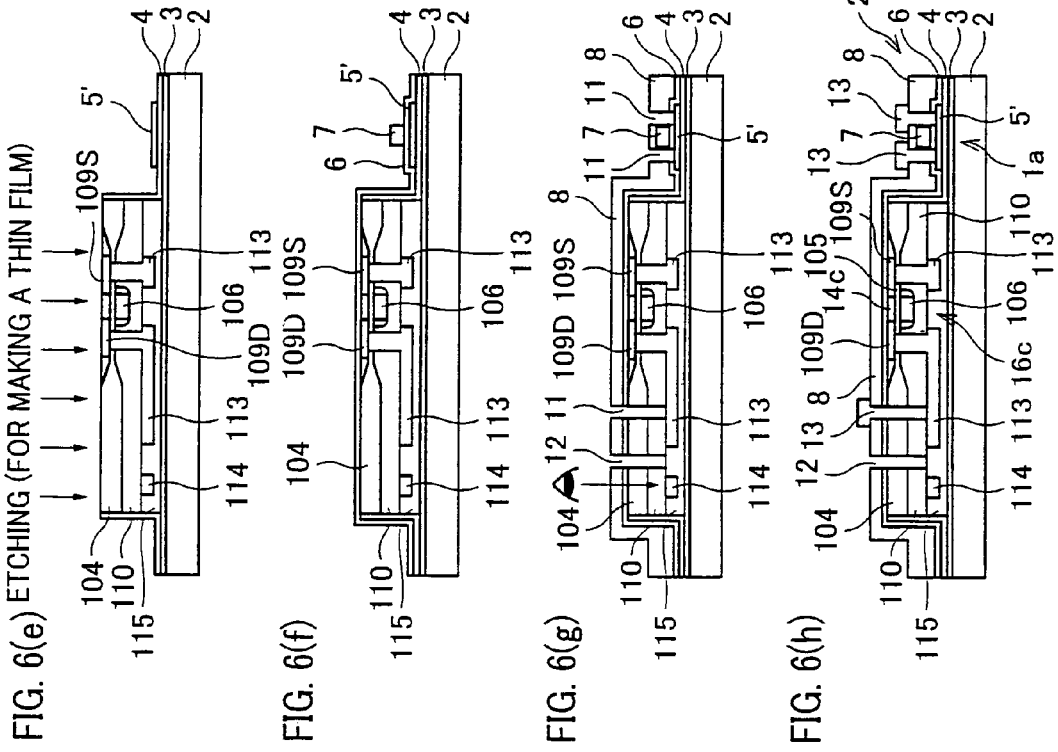
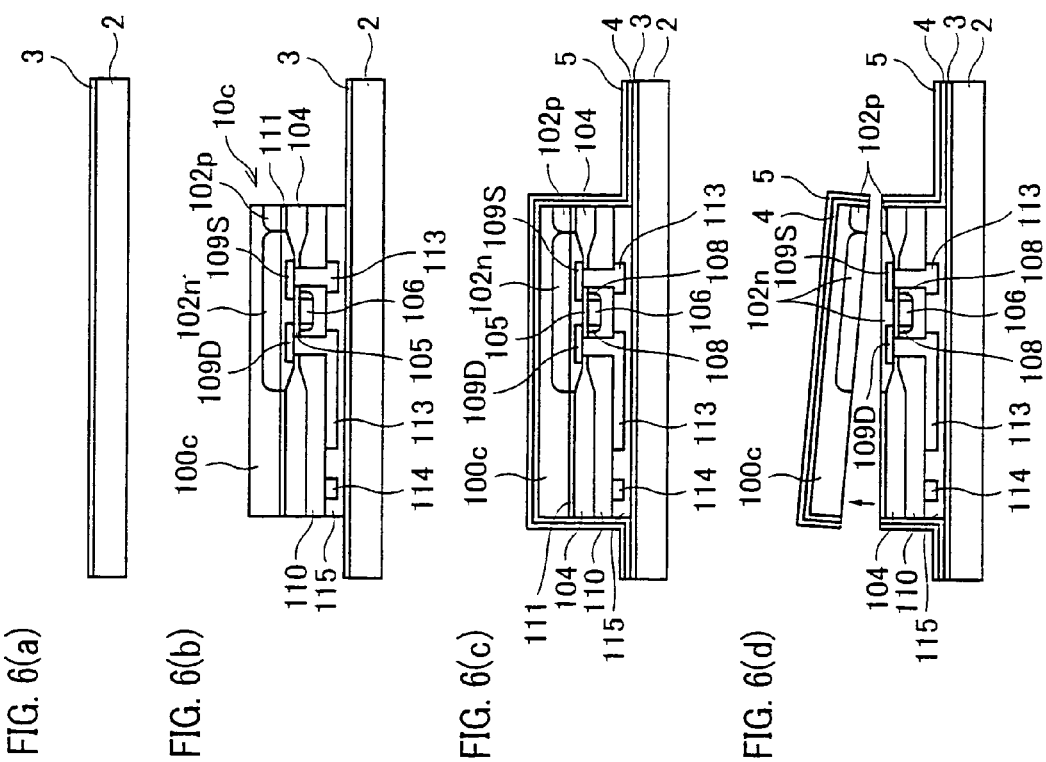

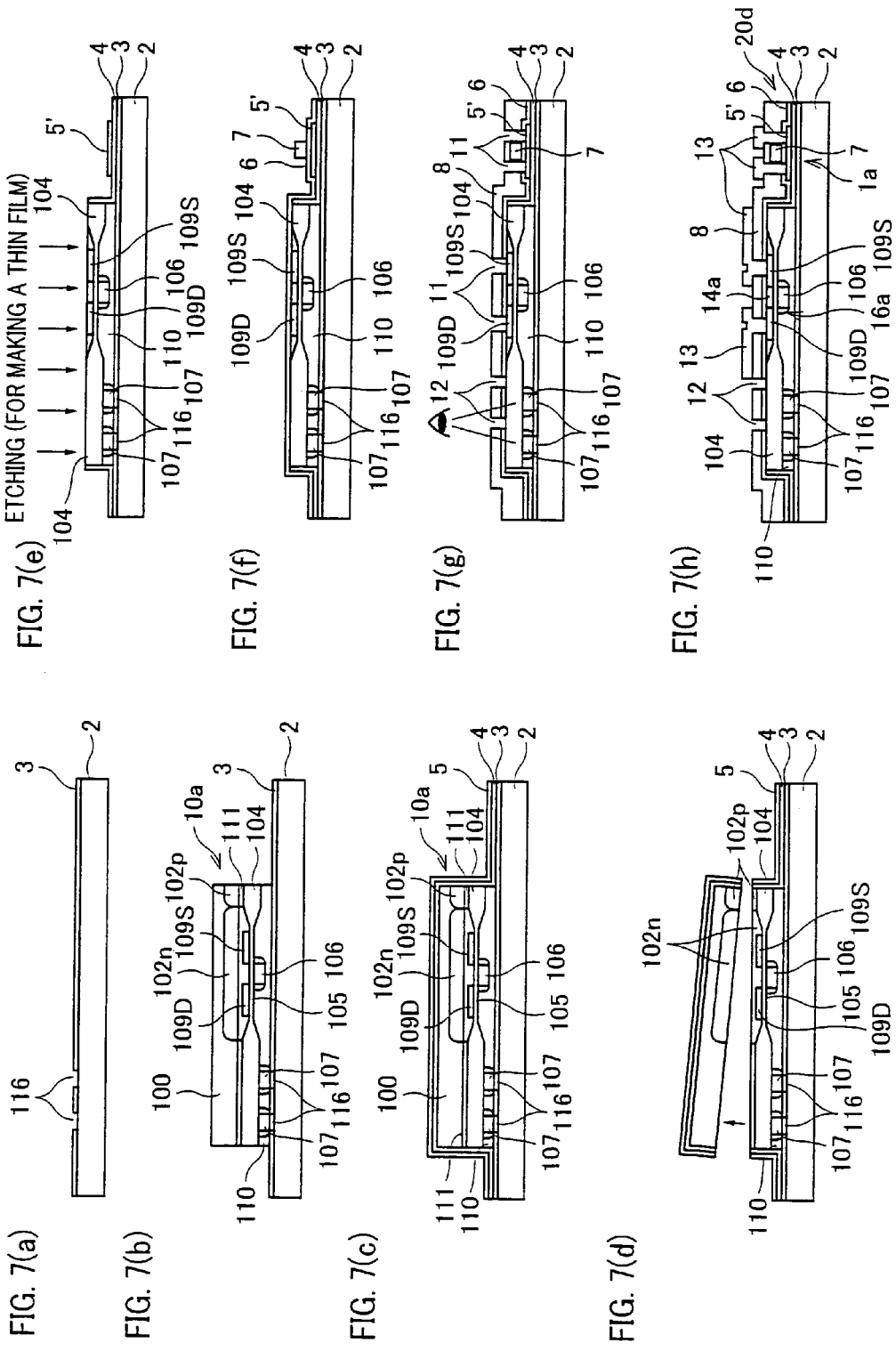

SEMICONDUCTOR DEVICE AND FABRICATION METHOD FOR THE SAME

This application is a Divisional of application Ser. No. 10/963,817, filed Oct. 14, 2004, now U.S. Pat. No. 7,205,204 the entire content of which is hereby incorporated herein by reference in this application.

This Nonprovisional application claims priority under 35 U.S.C. § 119(a) on Patent Application No. 2003/361734 filed in Japan on Oct. 22, 2003, No. 2004/212230 filed in Japan on Jul. 20, 2004 and the entire contents of which are hereby incorporated by reference.

FIELD OF THE INVENTION

The present invention relates to a semiconductor device with plural kinds of transistors of different characteristics formed on a single substrate, and also relates to a fabrication method of such a semiconductor device.

BACKGROUND OF THE INVENTION

An active-matrix display device, one of conventional display devices, carries out driving of a display panel, such as a liquid crystal display panel, or an organic EL display panel, by a thin film transistor ("TFT" hereinafter), that is made of an amorphous silicon (amorphous Si; "a-Si" hereinafter) or a polycrystalline silicon (polycrystalline Si; "p-Si" hereinafter) and is formed on a glass substrate.

Particularly common is one with integrated peripheral drivers using p-Si that offers fast operation by its high mobility.

For the system integration of high-performance devices such as an image processor or timing controller, there is a demand for a Si device with better performance.

The need for better performance arises from the insufficient performance of the transistor for making a high-performance Si device, owning to the fact that the mobility is decreased or S coefficient (sub-threshold coefficient) is increased by the presence of a local level in the gap caused by the incomplete crystallinity of the polycrystalline Si, or by the presence of a defect or such a gap local level in the vicinity of a crystal grain boundary.

In light of such a drawback, there has been a technique called SOI (silicon on insulator) in which a monocrystalline Si thin film etc. is bonded with a base substrate. For example, the specification of Japanese Patent No. 3278944 (published on Jul. 22, 1994) describes a method for bonding a base substrate with a substrate previously containing a semiconductor layer. This patent document describes a lamination-type SOI (Silicon On Insulator) semiconductor device in which a base substrate is bonded with a substrate containing a SOI semiconductor layer.

In the technique of the foregoing patent document, the base substrate is bonded with a semiconductor substrate that only contains a semiconductor layer, an element-isolating stage, an insulating layer, and a conductive layer. Meanwhile, there has been known another method in which a base substrate is bonded with a semiconductor substrate that is provided with the whole or the main part of the semiconductor device. Forming the whole or the main part of the semiconductor device on the substrate before bonding the substrate with a base substrate are more advantageous in the micro-fabrication of the monocrystalline Si thin film than forming the whole or the main part of the semiconductor device after transferred onto the base substrate.

For example, the specification of Japanese Patent No. 2743391 (published on Feb. 28, 1990) describes a fabrication method of a semiconductor memory in which a first semiconductor substrate, previously provided with a part of a MIS (Metal Insulator Semiconductor) transistor, is bonded with a second semiconductor substrate in the forming process of a MIS transistor.

Further, as another example, the specification of Japanese Patent No. 3141486 (published on Aug. 13, 1993) describes a semiconductor device including capacitors aligned under the semiconductor layer, wherein the base substrate is bonded with the bottoms of the capacitors via a planarizing layer. In this semiconductor device, non-cell region, i.e., other region than the cell region with the capacitors, is provided with a dummy pattern layer that is the same in thickness as the capacitors, so as to more easily ensure planarization by the planarizing layer, thus increasing bonding strength.

However, the foregoing conventional techniques of Japanese Patents No. 2743391 and No. 3141486 suffer from some difficulties in aligning components (for example, gate electrode etc. of the semiconductor device) in accordance with semiconductor device, after the substrate containing the semiconductor device is transferred to the base substrate.

More specifically, after the substrate having the semiconductor is transferred, the peripheral components should be aligned in accordance with the position of the semiconductor device; however, since the semiconductor substrate is not transparent, the components (gate electrode etc.) under the transferred substrate cannot be seen, thus failing to align them in desired positions.

SUMMARY OF THE INVENTION

The present invention was made in view of the foregoing problems in a semiconductor device including a transferred device that is transferred onto an insulating substrate, and an object of the invention is to ensure alignment of the peripheral components of the transferred device after the device is transferred to the insulating substrate.

In order to solve the foregoing problems, a semiconductor device according to the present invention includes: a first device and a second device that are both provided on an insulating substrate wherein the first device is a transferred layer that has been transferred onto the insulating substrate at least with an active layer, a gate insulating film and a gate electrode that are previously formed thereon, and the second device is formed on the insulating substrate by being deposited thereon, wherein: the gate electrode is formed to be closer to the insulating substrate than the active layer, and the transferred layer includes (a) a marker whose position is detectable by light and (b) a light-transmissive insulating film formed on an opposite side to a side of the insulating substrate with respect to the marker.

Here, the light-transmissive insulating film is an insulating film having a light-transmissive property with respect to the light for detecting the marker. Further, the active layer is a semiconductor layer including source, drain, a channel area etc., and has no light-transmissive property.

With the foregoing arrangement, a film formed on an opposite side to a side of the insulating substrate with respect to the marker is made of a light-transmissive insulating film. Therefore, the position of the marker is detectable by light from an opposite side of the semiconductor device to a side facing the insulating substrate.

By thus detecting the position of the marker, alignment of the components in accordance with the transferred layer may be securely performed. Namely, the alignment may be accurately and properly performed in accordance with the marker.

Therefore, in the semiconductor device fabrication step, the fabrication of the metal leads etc. after the transfer step may be performed with accurate and secure alignment. On this account, the misalignment of the metal leads etc. may be securely prevented, thereby realizing a highly-reliable semiconductor device.

Further, for example, the marker may be used for alignment on mounting the semiconductor device of the present invention to other substrate (e.g. an active matrix substrate of a liquid crystal display device), that allows secure mounting thereof with accurate alignment.

In order to solve the foregoing problems, a fabrication method of a semiconductor device according to the present invention is a method for fabricating a semiconductor device including a first device and a second device that are both provided on an insulating substrate wherein the first device is a transferred substrate that has been transferred onto the insulating substrate at least with an active layer, a gate insulating film and a gate electrode that are previously formed thereon, and the second device is formed on the insulating substrate by being deposited thereon, said method comprising the step of: (a) bonding the transferred substrate with the insulating substrate; (b) detaching a part of the transferred substrate after the step (a); and (c) forming a marker detectable by light before the step (a) on the transferred substrate on a portion allowing detection by light, that is performed after the step (b) from an opposite side of the transferred substrate to a side facing the insulating substrate, the marker being used for alignment in semiconductor device forming steps that are performed after the step (a).

With the foregoing arrangement, alignment of the components in accordance with the transferred layer in the fabrication steps after the bonding step may be securely performed in accordance with the detection result of the marker. Namely, the alignment may be accurately and properly performed in accordance with the marker. On this account, the misalignment of the metal leads etc. may be securely prevented, thereby realizing a highly-reliable semiconductor device.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 1(a) through 1(h) are cross sectional views showing fabrication steps of a transferred monocrystalline Si substrate in a semiconductor device according to the first embodiment of the present invention.

FIG. 2(a) through 2(h) are cross sectional views showing fabrication steps of the semiconductor device according to the first embodiment of the present invention.

FIG. 3(a) through 3(h) are cross sectional views showing fabrication steps of a transferred monocrystalline Si substrate in a semiconductor device according to the second embodiment of the present invention.

FIG. 4(a) through 4(h) are cross sectional views showing fabrication steps of the semiconductor device according to the second embodiment of the present invention.

FIG. 5(a) through 5(k) are cross sectional views showing fabrication steps of a transferred monocrystalline Si substrate in a semiconductor device according to the third embodiment of the present invention.

FIG. 6(a) through 6(h) are cross sectional views showing fabrication steps of the semiconductor device according to the third embodiment of the present invention.

FIG. 7(a) through 7(h) are cross sectional views showing fabrication steps of a semiconductor device according to the fourth embodiment of the present invention.

DESCRIPTION OF THE EMBODIMENTS

First Embodiment

One embodiment of the present invention is described below with reference to Figures.

As described herein, a semiconductor device 20 of the present embodiment provides improved performance and improved functionality by forming a MOS (Metal Oxide Semiconductor) non-monocrystalline Si thin film transistor (deposited device, second device) and a MOS monocrystalline Si thin film transistor (transferred device, first device) in different regions on an insulating substrate. As described in this embodiment, the semiconductor device 20 is formed on an active-matrix substrate using TFT.

The MOS thin film transistor is a common transistor including an active semiconductor layer, a gate electrode, a gate insulating film, and dense impurity doped regions (source electrodes and drain electrodes) formed on the both sides of a gate, wherein the gate electrode adjusts the carrier density of the semiconductor layer beneath the gate, so as to adjust a flow of source-drain current.

Some of the characteristics of the MOS transistors when realized in a CMOS (Complementary MOS) structure include low power consumption and their ability to produce a full output according to a power voltage. The MOS transistors are therefore suitable as low-power-consuming logic devices.

As illustrated in FIG. 2(h), a semiconductor device 20 of the present embodiment includes a $SiO_2$ (silicon oxide) film (oxidized film) 3, a MOS non-monocrystalline Si thin film transistor (second device) 1a with a polycrystalline Si thin film 5' (non-monocrystalline Si thin film 5'), a MOS monocrystalline Si thin film transistor (monocrystalline Si thin film device, first device) 16a with a monocrystalline Si thin film (active layer) 14a, and metal leads 13, all of which are formed on an insulating substrate 2.

As the insulating substrate 2, the high-strain-point glass ("code 1737", a product of Corning) (alkali-earth aluminoboro-sillicated glass) is used.

The $SiO_2$ film (insulating film) 3 is formed in a thickness of about 100 nm over the entire surface of the insulating substrate 2.

The MOS non-monocrystalline Si thin film transistor 1a with the non-monocrystalline Si thin film 5' has the polycrystalline Si thin film 5', a $SiO_2$ film 6 as a gate insulating film, and a gate electrode 7 of a polysilicon film on a SiO2 film 4 provided as an interlayer insulating film.

The MOS monocrystalline Si thin film transistor 16a with the monocrystalline Si thin film 14a includes a gate electrode 106, a planarizing film ($SiO_2$ film) 110, a $SiO_2$ film 105 as a gate insulating film, and the monocrystalline Si thin film 14a.

A main part of the monocrystalline Si thin film transistor 16a is formed on a monocrystalline Si wafer 100 (see FIG. 1(h)) before it is bonded with the insulating substrate 2. The monocrystalline Si wafer 100 is bonded with the insulating substrate 2 together with a field oxide film 104, the gate electrode 106 and an alignment mark 107, a gate insulating film 105, impurity implanted regions 109S and 109D. Forming the gate electrode on the monocrystalline Si substrate and carrying out thereon ion implantation of impurities for the source and drain are more advantageous in the micro-fabrication of the monocrystalline Si thin film than forming the thin film transistor after the monocrystalline Si thin film is formed on the insulating substrate 2. Note that, the alignment mark 107 is formed on the field oxide film 104 made of a SiO$_2$ having a light-transmissive property, from the same material as the gate electrode 106.

As described, the semiconductor device 20 of the present embodiment includes the MOS non-monocrystalline Si thin film transistor 1a and the MOS monocrystalline Si thin film transistor 16a together on a single substrate, i.e., the insulating substrate 2, thereby integrating circuits of different characteristics for improved performance and improved functionality. Further, a high-performance and multi-functional semiconductor device can be realized less expensively than forming all the transistors from the monocrystalline Si thin film alone on the insulating substrate 2.

Further, in the case of adopting the semiconductor device 20 for an active-matrix substrate of a liquid crystal display device, the semiconductor device 20 is modified to accommodate the liquid crystal display by further including SiNx (silicon nitride), a planarizing resin film, a via hole, and a transparent electrode. In this case, the region of the non-monocrystalline Si thin film 5' is provided with drivers and TFTs for display, and the region of the monocrystalline Si thin film 14a has a timing controller to meet the requirements of the high-performance device. Note that, the driver section may be realized by monocrystalline silicon or other materials, depending on cost and performance.

By thus deciding the function and use of the thin film transistor according to the respective characteristics of the monocrystalline Si thin film 14a and the non-monocrystalline Si thin film 5' making up the thin film transistor (device), the performance and functionality of the thin film transistor (device) can be improved.

Further, in the semiconductor device 20, because the integrated circuit is formed in each region of the non-monocrystalline Si thin film 5' and the monocrystalline Si thin film 14a, it is possible to form such as an integrated circuit with a pixel array in suitable regions according to a required structure and characteristic. The integrated circuits so formed in different regions can therefore have different operational speeds or operational power voltages. For example, the integrated circuits formed in different regions may be designed to differ from one another by at least one of the following criteria, including gate length, thickness of the gate insulating film, power voltage, and logic level.

As a result, a device is formed with different characteristics for each region, thereby realizing a semiconductor device with more functionality.

Further, in the semiconductor device 20, because the integrated circuit is formed in each region of the non-monocrystalline Si thin film 5' and the monocrystalline Si thin film 14a, the integrated circuits formed in these different regions can employ different processing rules. For example, when the channel length is short, while the absence of crystal boundary in the monocrystalline Si thin film region hardly causes variations in the TFT characteristics, the crystal boundary in the polycrystalline Si thin film region greatly increases such variations. This necessitates different processing rules in the respective regions. The present invention enables the integrated circuits to be suitably formed in these different regions according to required processing rules.

Further, in the semiconductor device 20 of the present embodiment, the metal lead pattern of the MOS monocrystalline Si thin film transistor 16a can be formed with a design rule that is less strict than that for the gate pattern.

This enables all of or part of the metal leads of the semiconductor device incorporating the MOS monocrystalline Si thin film transistor 16a to be processed simultaneously with the metal leads formed on a large substrate, thereby reducing cost and improving processability. In addition, interconnections with external leads, other circuit blocks, and TFT arrays become easier, thus reducing the percent yield of defective products caused by interconnection errors with an external device, etc.

It should be noted here that the size of the monocrystalline Si thin film 14a formed on the semiconductor device 20 is determined by the wafer size of the LSI manufacturing device. The wafer size of a common LSI manufacturing device is sufficient to satisfy various requirements of the monocrystalline Si thin film 14a, including speed, power consumption, high-speed logic, a timing generator, and a high-speed DAC (current buffer), which does not tolerate variations. The wafer size of a common LSI manufacturing device is also sufficient to form a processor, etc. Accordingly, a monocrystalline silicon wafer of 6 inches or 8 inches (a resistivity of about 10 Ωcm, and a thickness of about 0.7 mm) may be employed.

Here, the following explains a fabrication method of the semiconductor device 20.

In a fabrication method of the semiconductor device 20 of the present embodiment, a part of the monocrystalline Si thin film transistor 16a is first fabricated on a monocrystalline Si substrate (half-done transferred device) 10a, and then the part of the monocrystalline Si thin film transistor 16a is transferred from the monocrystalline Si substrate 10a onto the insulating substrate 2.

First, a fabrication method of the monocrystalline Si substrate 10a on which a part of the monocrystalline Si thin film transistor 16a is formed is explained with reference to FIGS. 1(a) through 1(h).

The monocrystalline Si substrate 10a is formed by a common integrated circuit fabrication process with a process temperature of about 1000° C., using a monocrystalline silicon wafer 100, which measures 6 inches or 8 inches (a resistivity of about 10 Ωcm, and a thickness of about 0.6 mm to 0.7 mm). The process is described below.

First, as shown in FIG. 1 (a), the surface of the monocrystalline Si wafer 100 is oxidized to form a SiO2 thin film 101. Further, a resist pattern (resist) 120 is formed on a region other than the region for the nMOS, and then B ion (impurity) is implanted, so as to form an impurity implanted region (channel, well) 102n. Then, the resist pattern 120 is removed after the impurity implanted region 102n is created. Note that, the impurity used for forming the nMOS is not limited to B ion.

Next, as shown in FIG. 1(b), a resist pattern (resist) 121 is formed on a region other than the region for the pMOS, and then P ion (impurity) is implanted, so as to form an impurity implanted region (channel, well) 102p. Then, the resist pattern 121 is removed after the impurity implanted region 102p is created. Note that, the impurity used for forming the pMOS is not limited to P ion.

Next, as shown in FIG. 1(c), a silicon nitride film (SiNx) 103 is formed on the monocrystalline wafer 100 on a portion where the elements are to be formed, so as to allow element isolation by a local oxidation (Locos oxidation; LOCOS method; Local Oxidation of Silicon). In this example, an approximately 50 nm thick silicon nitride film 103 is formed by the thermal CVD (Chemical Vapor Deposition) by flowing monosilane gas and ammonia gas into the wafer 100 at a temperature of about 800° C. Then, by photolithography, the silicon nitride film 103 so formed is patterned so that the film will exist only in the element-formed region.

Next, as shown in FIG. 1(d), the field section is thermally-oxidized in a thermal oxidization furnace (diffusion furnace) at a temperature of about 1050° C. so as to form a field oxide film (SiO$_2$ film) 104. This process may be performed by dry O$_2$ oxidization or pyrogenic oxidization. The field section is the boundary (element-isolation region) of the active region (element-formed region) on the monocrystalline Si wafer 100. The active region is to be used as a transistor.

Next, as shown in FIG. 1(e), the silicon nitride film 103, that is no longer required, is removed by dry etching using, for example, a mixture of carbon tetrafluoride gas and hydrogen gas. Here, a damaged part of Si surface (a part of the SiO$_2$ film 104) through the etching step may be removed by sacrifice oxidization or etching.

Then, the portion (element-formed region) where the monocrystalline Si thin film transistor 16a is to be formed is oxidized in a thermal oxidization furnace (diffusion furnace) so as to form a gate insulating film (SiO2 film) 105. The oxidization is carried out through dry HCl oxidization or pyrogenic oxidization at a temperature of approximately 1050° C. In this manner, an insulating film 105 is formed with a thickness of 5 nm to 30 nm depending on the gate length of the monocrystalline Si thin film transistor 16a.

Next, a polysilicon film (not shown) of 150 nm to 300 nm thick is formed through thermal CVD or the like for later fabrication of the gate electrode 106 and the alignment mark (marker) 107. Specifically, the polysilicon film (not shown) is deposited by flowing monosilane gas (diluted by inactive gas such as nitrogen gas) onto the monocrystalline Si wafer 100 under reduced pressures (50 Pa to 200 Pa) and at a temperature of about 600° C. The resistance of the resulting polysilicon film is then reduced by n+ diffusion etc, i.e., the film is subjected to diffusion annealing by: deposition of n+ (POC 13).

Then, by photolithography, the polysilicon film so formed is patterned into the shape of the gate electrodes 106 and the alignment mark 107. Specifically, the gate electrodes 106 and the alignment mark 107 are formed by patterning the polysilicon film in the steps of applying (patterning), exposing, and developing a photoresist, followed by silicon etching and removal of the photoresist. In other words, patterning of gate electrode and alignment mark is performed. Note that, the gate electrode 106 is formed in the element-formed region, and the marker 107 is formed in the field section.

Thereafter, as shown in FIG. 1(f), impurities are implanted to a predetermined portion of the monocrystalline Si wafer 100 so as to form a LLD (Lightly Doped Drain Structure) region of source and drain of the semiconductor. n− (P ion) is implanted to an nMOS and p− (B ion) is implanted to a pMOS.

Further, a SiO$_2$ film is deposited by LPCVD (Low Pressure Chemical Vapor Deposition: Low Pressure CVD) or the like and then the film is etched back by RIE (Reactive Ion Etching), thereby forming a side wall 108 at the gate edge (a lateral edge of the gate electrode 106) and a lateral edge of the alignment mark 107. Further, n+ (AS ion) is implanted to the nMOS, p+ (BF2 ion) is implanted to the pMOS, so as to form respective source and drain regions. Further, when the gate length is short, reverse conduction impurities are implanted (through HALO implantation) from an oblique direction as required. In this manner, the impurity implanted region (source) 109S and the impurity implanted region (drain) 109D are formed.

Then, heat processing is carried out at a temperature of about 900° C. to 1000° C. to recover the damage of the crystal of the silicon after implantation of impurities and activate the impurities as a donor (an impurity for producing n-type semiconductor) or an acceptor (an impurity for producing p-type semiconductor). The heat processing should be stopped before phosphorus (P) or Boron (B) greatly diffuses.

Then, as shown in FIG. 1(g), an interlayer insulating film 110 is formed by a thermal CVD method etc. Since the interlayer insulating film 110 may be less dense than the gate insulating film 105, a SiO$_2$ film of about 300 nm to 400 nm thick is formed as the interlayer insulating film 110 by flowing monosilane gas and oxygen gas under reduced pressures (100 Pa to 200 Pa) and at a temperature of about 400° C. Then, by a CMP (Chemical Mechanical Polishing) method etc., the wafer surface (the surface of the interlayer insulating film 110) is planarized. Here, the interlayer insulating film 110 is planarized to not more than 0.1 nm in a Ra value.

In the next step, as shown in FIG. 1(h), hydrogen ion implantation is carried out onto the monocrystalline Si wafer 100 to form a hydrogen ion implanted region 111. The implantation of hydrogen ion is carried out with an appropriate acceleration voltage according to a desired thickness, and a dose of about $5 \times 10^{16}$/cm$^2$. Further, though only hydrogen ion is implanted in the present embodiment, a hydrogen ion implanted region 111 may be formed by implanting both hydrogen ion and the rare gas ion.

Further, the monocrystalline silicon wafer 100 with a surface including a part of the monocrystalline thin film transistor 16a is then cut into individual monocrystalline Si substrates 10a of a required size (the cutting step is not illustrated).

Referring to FIG. 2(a) through FIG. 2(h), description is made further as to how the semiconductor device 20 is fabricated.

First, the insulating substrate 2 is cleaned without disturbing its surface. In the present embodiment, the insulating substrate (insulative-substrate) 2 is made of a high-strain-point approximately 600° C.) glass ("code 1737", a product of Corning) (alkali-earth alumino-boro-sillicated glass) of about 0.7 mm thick.

Then, a SiO$_2$ film 3 of about 100 nm thick is deposited over the entire surface of the insulating substrate 2 by a plasma CVD method, as shown in FIG. 2(a). Specifically, a mixture gas of TEOS (Tetra Ethyl Ortho-Silicate) and O$_2$ is flown onto the entire surface of the insulating substrate 2 under reduced pressures of about 100 Pa to about 200 Pa and at a temperature of about 300° C., and a SiO$_2$ film etc. of about 100 nm thick is formed on the substrate by plasma discharge.

Then, as shown in FIG. 2(b), after activating the insulating substrate 2 and the monocrystalline Si substrate 10a with a part or the whole of the transferred device by SC1 cleaning, the monocrystalline Si substrate 10a on the side of the hydrogen ion implanted region 111 is aligned on a predetermined position so as to be bonded in contact with the insulating substrate 2 at room temperature.

The surface cleanness and activity of the insulating substrate 2 (light-transmissive amorphous substrate (with the SiO$_2$ coating film)) and the monocrystalline Si substrate 10a (transferred device substrate with the oxidized surface) become very important when these two substrates are to be bonded together without an adhesive. For this reason, the insulating substrate 2 and the monocrystalline Si substrate 10a are cleaned with a liquid called "SC1" and are dried before bonded.

The SC1 liquid is prepared by mixing commercially available ammonia water (NH4OH: 30%), hydrogen peroxide water (H2O2:30%), and pure water (H2O). For example, a mixture of the ammonia water, hydrogen peroxide water, and pure water at a ratio of 5:12:60 is used. The temperature of the SC1 liquid may be room temperature. Cleaning is carried out by immersing the substrates in the SC1 liquid for 5 minutes. It is not preferable to immerse the substrates in the SCI liquid for an extended time period, because the ammonia water slightly etches the surface of the silicon oxide layer (Ultra Clean ULSI Technique, Tadahiro Oomi, Baifukan Co., Ltd. p. 172). The substrates are then cleaned with flown pure water (a resistivity of 10 MΩcm or greater) for 10 minutes, and are quickly dried with a spin drier, etc. After cleaning and drying, the insulating substrate 2 and the monocrystalline Si substrate 10a are brought into contact with each other and a slight force is applied. As a result, the two substrates attract each other and are bonded together, even though no adhesive is used.

The adhesive-less bonding of the monocrystalline Si substrate 10a and the insulating substrate 2 is realized by a combination of van der Waals force, electric dipole and hydrogen bonding. The bonding of the two substrates is facilitated when these forces act on each other in similar proportions.

In the next step, as shown in FIG. 2(c), the $SiO_2$ film 4 of about 200 nm thick and an amorphous Si film 5 of about 50 nm thick are formed over the entire surface of the insulating substrate 2. These films are both deposited by plasma CVD method (plasma chemical vapor deposition method).

More specifically, the SiO2 film 4 is deposited by flowing a mixture gas of TEOS (Tetra Ethyl Ortho-Silicate) and $O_2$ under reduced pressures of about 100 Pa to about 200 Pa and at a temperature of about 300° C. under plasma discharge. Meanwhile, the amorphous Si film 5 is deposited by flowing monosilane gas and hydrogen gas at a temperature of about 250° C. under plasma discharge.

Next, as shown in FIG. 2 d), a part of the monocrystalline Si substrate 10a is cleaved and divided through heat treatment of about 450° C. to 600° C. This heat treatment plays the roles of dehydrogenation step of the amorphous Si film 5 and detaching step of the monocrystalline Si substrate 10a with a part or the whole of the transferred device from the hydrogen ion implanted region 111. As a result, there is created a substrate containing both a part of the monocrystalline Si thin film transistor 16a (transferred monocrystalline Si device) and a non-monocrystalline semiconductor film (amorphous Si film 5) that is deposited on the insulating substrate 2.

Next, the semiconductor film (amorphous Si film 5) deposited on the insulating substrate 2 is modified from an amorphous (amorphous Si film 5): to polycrystalline state (polycrystalline Si film (polycrystalline Si film, non-monocrystalline Si thin film) 5') by the polycrystallization using an energy beam. Namely, by irradiation of an excimer laser, the amorphous Si thin film 5 is heated and crystallized to grow a polymonocrystalline Si layer and thereby form the polymonocrystalline Si thin film 5'. Note that, the polycrystallization may be performed by an SLS (Sequential Lateral solidification: SLS) method. In this way, the amorphous Si film a is modified to a polycrystalline Si film 5' on the substrate containing both a part of the monocrystalline Si thin film transistor 16a (monocrystalline Si device) and a semiconductor film that is deposited on the insulating substrate 2.

Then, as shown in FIG. 2(e), in order to provide portions for the active region of the device, unwanted portions of the polycrystalline Si film 5' are removed to obtain a discrete pattern in the polymonocrystalline Si film 5'. The pattern of the polycrystalline Si film 5' becomes the semiconductor layer of the non-monocrystalline Si thin film transistor 1a.

Further, again referring to FIG. 2(e), dry etching is carried out with respect to a part of the monocrystalline Si thin film transistor 16a bonded with the insulating substrate 2 to reduce its thickness, thereby forming a thin film of a monocrystalline Si thin film 14a. Further, wet light etching for removing damages, and defect recovering heat treatment (defect recovering annealing) are sequentially carried out.

Then, as shown in FIG. 2(f), a $SiO_2$ film 6 of appropriately 60 nm thick is formed by plasma CVD using a mixture of $SiH_4$ gas and $N_2O$ gas. This $SiO_2$ film 6 functions as the gate insulating film of the non-monocrystalline Si thin film transistor 1a. Further, a gate electrode 7 of the non-monocrystalline Si thin film transistor 1a is formed on the $SiO_2$ film 6.

Further, as shown in FIG. 2(g), a $SiO_2$ film 8 of appropriately 350 nm thick is formed by a P-CVD using a mixture of TEOS and $O_2$ (oxygen). This $SiO_2$ film 8 functions as an interlayer planarizing insulating film.

Further, the alignment mark 107 in the monocrystalline Si device region is detected through the $SiO_2$ films 8, 6 and 104 for positioning, before forming a resist pattern (not shown). Then, a contact hole 11 and an alignment mark (marker) 12 are formed on the $SiO_2$ films 8, 6 and 104. In this way, the respective layers to be provided with metal leads are properly positioned, before patterned.

Next, a metal layer is provided in a predetermined area of the $SiO_2$ film 8 and the contact hole 11. Then, a resist pattern (not shown) is formed according to the alignment mark 12, and the metal layer is etched. As a result, metal leads 13 are obtained as shown in FIG. 2(h). In this manner, the monocrystalline Si thin film transistor 16a and the non-monocrystalline Si thin film transistor 1a are formed on the insulating substrate 2.

As described, according to the fabrication method of a semiconductor device of the present embodiment, an alignment mark 107 is formed on the monocrystalline Si substrate 10a, and, further, a field oxide film ($SiO_2$ film) 104 created through LOCOS oxidization, the gate insulating film ($SiO_2$ film) 6, and an interlayer insulating film ($SiO_2$ film) 8 are formed on the alignment mark 107. In other words, a $SiO_2$ layer is formed on the alignment mark 107. In this arrangement, the layer between the alignment mark 107 and the monocrystalline Si substrate 10a bonded with the insulating substrate 2 has a light-transmissive property.

This arrangement allows proper and easy alignment of a mask after the transfer step. Namely, in the device forming step after the transfer step, the alignment of components may be securely and accurately performed based on the gate electrode of the transferred device.

Further, in the present embodiment, the alignment mark 107 is formed on the element-isolation region of the monocrystalline Si thin film transistor 16a. In this arrangement, the alignment mark 107 does not cause a decrease in performance of the monocrystalline Si thin film transistor 16a.

Further, in the fabrication method of the semiconductor device according to the present embodiment, the monocrystalline Si substrate 10a is formed before the polycrystal Si thin film (non-monocrystalline Si thin film) 5' is formed. This allows the monocrystalline Si substrate 10a to be transferred onto a flat surface of the insulating substrate 2 and therefore prevent the problem of contact failure, etc.

For the insulation substrate 2 of the present invention, other material than the "code 1737", a product of Corning (alkali-earth alumino-boro-sillicated glass) may be used.

Further, the semiconductor device 20 of the present embodiment is formed on an active matrix substrate; however, the semiconductor device 20 may be used for many other purposes.

Further, the transferred device to be transferred to the insulating substrate 2 is not limited to the monocrystalline Si thin film transistor 16a described in the explanation of the present embodiment.

Further, the transferred device to be transferred to the insulating substrate 2 is not limited to the monocrystalline Si substrate 10a including the monocrystalline Si thin film transistor 16a. For example, a substrate including a part of the transferred device may be transferred to the insulating substrate 2, and the rest of components may be formed thereafter. However, it should be noted that the micro-fabrication of the device, such as formation of gate electrode or implantation of impurities, is preferably carried out before the transfer.

Further, the alignment mark 107 of the present embodiment is formed on the same layer, from the same material, and in the same fabrication step as those for the gate electrode 106. Therefore, separate fabrication process for the alignment mark 107 is not necessary, thus simplifying the fabrication and reducing manufacturing cost. Further, the same condition may be used for formation of the alignment mark 107 and formation of the gate electrode 106; accordingly, in the later steps, detection of the gate electrode 106 in accordance with the alignment mark 107 may be carried out with a good accuracy, almost as accurate as detection of the gate electrode 106 itself.

Further, in the present embodiment, the detection of position of the alignment mark 107 is performed by visible light; however, infrared light or UV (ultraviolet) light etc. may also be used.

Further, the present embodiment uses a $SiO_2$ film for the materials of the insulating film 3, the gate insulating film 6, the interlayer insulating film 8, the field oxide film 107 and the interlayer insulating film 110; however, these films may be formed from other materials as long as they are provided with a light-transmissive insulating property, that allows light transmission for detecting the position of the alignment mark 107. However, a $SiO_2$ film or a film mainly containing $SiO_2$ film is commonly used for an insulating film, thus offering easy fabrication and high insulative property.

Further, in the present embodiment, the gate electrode 106 of the monocrystalline Si thin film transistor is formed in a portion closer to the insulating substrate 2 than the monocrystalline Si thin film transistor 14a after the transfer. This allows easy processing of, such as etching, metal leads etc. of the monocrystalline Si thin film transistor 14a after the transfer.

Further, in the present embodiment, the monocrystalline Si substrate 10a is provided with a hydrogen ion implanted region (a layer containing hydrogen ion or hydrogen ion and rare gas) before bonded with the insulating substrate 2, and after the bonding, a part of the monocrystalline Si substrate 10a is detached from the hydrogen ion implanted region by heat treatment. However, the part of the monocrystalline Si substrate 10a may be removed by some other ways.

Further, in the present embodiment, the alignment mark 107 is formed on the element-isolation region of the monocrystalline Si substrate 10a; however, the mark may be provided in any portions allowing detection after the monocrystalline Si substrate 10a is bonded with the insulating substrate 2.

Second Embodiment

Another embodiment of the present invention is explained below with reference to the figures.

In the first embodiment above, the element isolation was realized by Locos Oxidization (field oxide film ($SiO_2$ film) 104); however, there are some alternatives. For example, element isolation may be realized by shallow trench isolation (trench isolation), in which the alignment mark is formed on the filled hole of the trench section.

The present embodiment explains a semiconductor device and a fabrication method thereof, in which the element isolation of the monocrystalline Si substrate is realized by trench isolation.

The present embodiment uses a semiconductor device 20b that is the same as the semiconductor device 20 above, except for a monocrystalline Si substrate 10b having different structure of the element-isolation region from that of the monocrystalline Si substrate 10a. For ease of explanation, materials having the equivalent functions as those shown in the drawings pertaining to the first embodiment above will be given the same reference symbols, and explanation thereof will be omitted here.

As illustrated in FIG. 4(h), a semiconductor device 20b of the present embodiment includes a non-monocrystalline Si thin film transistor 1a, and a MOS monocrystalline Si thin film transistor (monocrystalline Si thin film device) 16b with a monocrystalline Si thin film 14b, which are formed on an insulating substrate 2.

The MOS monocrystalline Si thin film transistor 16b with the monocrystalline Si thin film 14b includes a gate electrode 206, a planarizing film ($SiO_2$ film) 210, a $SiO_2$ film 205 as a gate insulating film, and the monocrystalline Si thin film 14b.

The monocrystalline Si thin film transistor 16b is formed on a monocrystalline Si wafer 100b before it is bonded with the insulating substrate 2. The monocrystalline Si wafer 10b is bonded with the insulating substrate 2 together with a gate electrode 206, an alignment mark 207, a gate insulating film 205, and impurity implanted regions 209S and 209D. Note that, the alignment mark 207 is formed on an insulating film ($SiO_2$ film) 202, and the gate insulating film 205. The insulating film 202 is provided on the monocrystalline Si wafer 100b for element isolation, in portions of trenches 201a and 201b (see FIG. 3(h)), before the wafer 100b is bonded with the insulating substrate 2.

Here, the following explains a fabrication method of the semiconductor device 20b.

In a fabrication method of the semiconductor device 20b of the present embodiment, a part of the monocrystalline Si thin film transistor (transferred device) 16b is first fabricated on a monocrystalline Si substrate (half-done transferred device) 10b, and then the part of the monocrystalline Si thin film transistor 16b is transferred from the monocrystalline Si substrate 10b onto the insulating substrate 2.

First, a fabrication method of the monocrystalline Si substrate 10b on which a part of the monocrystalline Si thin film transistor 16b is formed is explained with reference to FIGS. 3(a) through 3(h). The monocrystalline Si substrate 10b is formed on a monocrystalline silicon wafer 100b, which measures 6 inches or 8 inches (a resistivity of about 10 Ωcm, and a thickness of about 0.6 mm to 0.7 mm). The process is described below.

First, as shown in FIG. 3(a), the surface of monocrystalline silicon wafer 100b is etched so as to form shallow trenches 201a and 201b. Then, a $SiO_2$ film 202 with a thickness substantially equal to the depth of the trenches is formed over the entire surface of the monocrystalline silicon wafer 100b.

Next, a resist pattern (resist) 220 is formed on each of the trenches. Then, the $SiO_2$ film 202 is removed except for the portion having the resist pattern 220. The $SiO_2$ film left on the trench section is processed to a discrete pattern with an area substantially the same size or twice the width of the trench. The resist pattern 220 is made in an appropriately size when formed on the trench section. Note that, some of the $SiO_2$ film may be left in the vicinity of the trench, as shown in FIG. 3(a).

Next, as shown in FIG. 3(b), a substantially flat SiO$_2$ film 203 is deposited over the entire surface of the monocrystalline silicon wafer 100b.

Next, as shown in FIG. 3(c), the resist pattern (resist) 221 is formed on the surface of the SiO$_2$ film 203 except for the portion between the trenches including a part of each trench. Then, B ion (impurities) is implanted to on the area (of SiO$_2$ film 203) not having the resist pattern 221, so as to form an impurity implanted region (channel, well) 204n. Then, the resist pattern 221 is removed after the impurity implanted region 204n is created. Note that, the impurity used for forming the nMOS is not limited to B ion.

Next, as shown in FIG. 3(d), a resist pattern (resist) 222 is formed on the impurity implanted region 204n. Then, P ion (impurities) is implanted to the area (of SiO$_2$ film 203) not having the resist pattern 222, so as to form an impurity implanted region (channel, well) 204p. Then, the resist pattern 222 is removed after impurity implanted region 204p is created. Note that, the impurity used for forming the pMOS is not limited to P ion.

Next, as shown in FIG. 3(e), the SiO$_2$ film 203 is partly removed to expose the Si surface. More specifically, the SiO$_2$ film 203 is removed except for the trench sections 201a and 201b. Then, the monocrystalline silicon wafer 100b is thermally-oxidized substantially entirely to form a gate insulating film (SiO$_2$ film) 205. This process may be performed by HCl oxidization or pyrogenic oxidization at a temperature of approximately 1050° C., for example.

Next, a polysilicon film (not shown) of 150 nm to 300 nm thick is formed through thermal CVD or the like for later fabrication of the gate electrode 206 and the alignment mark (marker) 207. Specifically, the polysilicon film (not shown) is deposited by flowing monosilane gas (diluted by inactive gas such as nitrogen gas) onto the monocrystalline Si wafer 100b under reduced pressures (50 Pa to 200 Pa) and at a temperature of about 600° C. The resistance of the resulting polysilicon film is then reduced by n+ diffusion etc, i.e., the film is subjected to diffusion annealing by deposition of n+ (POC 13).

Then, by photolithography, the polysilicon film so formed is patterned into the shape of the gate electrodes 206 and the alignment mark 207. Specifically, the gate electrodes 206 and the alignment mark 207 are formed by patterning the polysilicon film in the steps of applying (patterning), exposing, and developing a photoresist, followed by silicon etching and removal of the photoresist. Note that, the gate electrode 206 is formed in the element-formed region (the region isolated by the trench section), and the marker 207 is formed in the trench section.

Thereafter, as shown in FIG. 3(f), impurities (ion) are implanted to a predetermined portion of the monocrystalline Si wafer 100b so as to form a LDD (Lightly Doped Drain Structure) region of source and drain of the semiconductor. Namely, n– (P ion) is implanted to an nMOS and p– (B ion) is implanted to a pMOS. Further, a SiO$_2$ film is deposited by LPCVD (Low Pressure Chemical Vapor Deposition: Low Pressure CVD) or the like and then the film is etched back by RIE (Reactive Ion Etching), thereby forming a side wall 208 at the gate edge (a lateral edge of the gate electrode 206) and a lateral edge of the alignment mark 207. Further, n+ (AS ion) is implanted to the nMOS, p+ (BF2 ion) is implanted to the pMOS, so as to form respective source and drain regions. Further, when the gate length is short, reverse conduction impurities are implanted (through HALO implantation) from an oblique direction as required. In this manner, the impurity implanted region (source) 209S and the impurity implanted region (drain) 209D are formed.

Then, heat processing is carried out at a temperature of about 900° C. to 1000° C. to recover the damage of the crystal of the silicon after implantation of impurities and activate the impurities as a donor (an impurity for producing n-type semiconductor) or an acceptor (an impurity for producing p-type semiconductor). The heat processing should be stopped before phosphorus (P) or Boron (B) greatly diffuses.

Then, as shown in FIG. 3(g), an interlayer insulating film 210 is formed by a thermal CVD method etc. Since the interlayer insulating film 210 may be less dense than the gate insulating film 205, a SiO$_2$ film of about 300 nm to 400 nm thick is formed as the interlayer insulating film 210 by flowing monosilane gas and oxygen gas under reduced pressures (100 Pa to 200 Pa) and at a temperature of about 400° C. Then, by a CMP (Chemical Mechanical Polishing) method etc., the wafer surface (the surface of the interlayer insulating film 210) is planarized. Here, the interlayer insulating film 210 is planarized to not more than 0.1 nm in a Ra value.

In the next step, as shown in FIG. 3(h), hydrogen ion implantation is carried out onto the monocrystalline Si wafer 100b to form a hydrogen ion implanted region 211. The implantation of hydrogen ion is carried out with an appropriate acceleration voltage according to a desired thickness, and a dose of about $5 \times 10^{16}$/cm$^2$. Further, though only hydrogen ion is implanted in the present embodiment, a hydrogen ion implanted region 211 may be formed by implanting both hydrogen ion and the rare gas ion.

Further, the monocrystalline silicon wafer 100b with a surface including a part of the monocrystalline thin film transistor 16b is then cut into individual monocrystalline Si substrates 10b of a required size (the cutting process is not illustrated).

Referring to FIG. 4(a) through FIG. 4(h), description is made further as to how the semiconductor device 20b is fabricated.

First, the insulating substrate 2 is cleaned without disturbing its surface. In the present embodiment, the insulating substrate (insulative-substrate) 2 is made of a high-strain-point (approximately 600° C.) glass ("code 1737", a product of Corning) (alkali-earth alumino-boro-sillicated glass) of about 0.7 mm thick.

Then, a SiO$_2$ film 3 of about 100 nm thick is deposited over the entire surface of the insulating substrate 2 by a plasma CVD method. Specifically, a mixture gas of TEOS (Tetra Ethyl Ortho-Silicate) and O$_2$ is flown onto the entire surface of the insulating substrate 2 under reduced pressures of about 100 Pa to about 200 Pa and at a temperature of about 300° C., and a SiO$_2$ film etc. of about 100 nm thick is formed on the substrate by plasma discharge.

Then, as shown in FIG. 4(a), after activating the insulating substrate 2 and the monocrystalline Si substrate 10b with a part or the whole of the transferred device by SC1 cleaning, the monocrystalline Si substrate 10b on the side of the hydrogen ion implanted region 211 is aligned on a predetermined position so as to be bonded in contact with the insulating substrate 2 at room temperature.

In the next step, as shown in FIG. 4(b), the SiO$_2$ film 4 of about 200 nm thick and an amorphous Si film 5 of about 50 nm thick are formed over the entire surface of the insulating substrate 2. These films are both deposited by plasma CVD method (plasma chemical vapor deposition method).

More specifically, the SiO$_2$ film 4 is deposited by flowing a mixture gas of TEOS (Tetra Ethyl Ortho-Silicate) and O$_2$ under reduced pressures of about 100 Pa to about 200 Pa and at a temperature of about 300° C. under plasma discharge. Meanwhile, the amorphous Si film 5 is deposited by flowing monosilane gas and hydrogen gas at a temperature of about 250° C. under plasma discharge.

Next, as shown in FIG. 4 (c), a part of the monocrystalline Si substrate 10b is cleaved and divided through heat treatment of about 450° C. to 600° C. This heat treatment plays the roles of dehydrogenation process of the amorphous Si film 5 and detaching process of the monocrystalline Si substrate 10b with a part or the whole of the transferred device from the hydrogen ion implanted region 211. As a result, there is created a substrate containing both a part of the monocrystalline Si thin film transistor 16b (transferred monocrystalline Si device) and a non-monocrystalline semiconductor film (amorphous Si film 5) that is deposited on the insulating substrate 2.

Next, the semiconductor film (amorphous Si film 5) deposited on the insulating substrate 2 is modified from an amorphous (amorphous Si film 5) to polycrystalline state (polycrystalline Si film (polycrystalline Si film, non-monocrystalline Si thin film) 5') by the polycrystallization using an energy beam. Namely, by irradiation of an excimer laser, the amorphous Si thin film 5 is heated and crystallized to grow a non-monocrystalline Si layer and thereby form the non-monocrystalline Si thin film 5'. Note that, the polycrystallization may be performed by an SLS (Sequential Lateral solidification: SLS) method. In this way, the amorphous Si film 5 is modified to a polycrystalline Si film 5' on the substrate containing both a part of the monocrystalline Si thin film transistor 16b (monocrystalline Si device) and a semiconductor film that is deposited on the insulating substrate 2.

Then, as shown in FIG. 4(d), in order to provide portions for the active region of the device, unwanted portions of the polycrystalline Si film 5' are removed to obtain a discrete pattern in the non-monocrystalline Si film 5'. The pattern of the polycrystalline Si film 5' becomes the semiconductor layer of the non-monocrystalline Si thin film transistor 1a.

Further, again referring to FIG. 4(e), dry etching is carried out with respect to a part of the monocrystalline Si thin film transistor 16b bonded with the insulating substrate 2 to reduce its thickness, thereby forming a thin film of a monocrystalline Si thin film 14b. Further, wet light etching for removal of damages and defect recovering heat treatment (defect recovering annealing) are sequentially carried out.

Then, as shown in FIG. 4(f), a SiO$_2$ film 6 of appropriately 60 nm thick is formed by plasma CVD using a mixture of SiH$_4$ gas and N$_2$O gas. This SiO$_2$ film 6 functions as the gate insulating film of the non-monocrystalline Si thin film transistor 1a. Here, side walls are formed on respective ends of the patterns of the monocrystalline Si thin film 14b and the polycrystalline Si thin film 5'. Further, a gate electrode 7 of the non-monocrystalline Si thin film transistor 1a is formed on the SiO$_2$ film 6.

Further, as shown in FIG. 4(g), a SiO$_2$ film 8 of appropriately 350 nm thick is formed by a P-CVD using a mixture of TEOS and O$_2$ (oxygen). This SiO$_2$ film 8 functions as an interlayer planarizing insulating film.

Further, the alignment mark 207 in the monocrystalline Si device region is detected through the SiO$_2$ films 8, 6 and 205 for positioning (alignment), before forming a resist pattern (not shown). Then, a contact hole 11 and an alignment mark (marker) 12 are formed on the SiO$_2$ films 8, 6 and 205. In this way, the respective layers to be provided with metal leads are properly positioned, before patterned.

Next, a metal layer is provided in a predetermined area of the SiO$_2$ film 8 and the contact hole 11. Then, a resist pattern (not shown) is formed according to the alignment mark 12, and the metal layer is etched. In this manner, the monocrystalline Si thin film transistor (transferred device) 16b and the non-monocrystalline Si thin film transistor (deposited device) 1a are formed on the insulating substrate 2.

Next, a metal layer is provided in a predetermined area of the SiO$_2$ film 8 and the contact hole 11. Then, a resist pattern (not shown) is formed according to the alignment mark 12, and the metal layer is etched.

As described, according to the fabrication method of a semiconductor device of the present embodiment, an alignment mark 207 is formed on the monocrystalline Si substrate 10b, and, further, a SiO$_2$ film 202 created through trench isolation method for element isolation, the gate insulating film (SiO$_2$ film) 205 of the monocrystalline Si thin film transistor 16b, the gate insulating film (SiO$_2$ film) 6 of the non-monocrystalline Si thin film transistor 1a, and an interlayer insulating film (SiO$_2$ film) 8 are formed on the alignment mark 207. In other words, a SiO$_2$ layer is formed on the alignment mark 207. In this arrangement, the layer between the alignment mark 207 and the monocrystalline Si substrate 10b bonded with the insulating substrate 2 has a light-transmissive property.

This arrangement allows proper and easy alignment of a mask after the transfer process. Namely, in the device forming step after the transfer process, the alignment of components may be securely and accurately performed based on the gate electrode of the transferred device.

Further, in the present embodiment, the alignment mark 207 is formed on the element-isolation region of the monocrystalline Si thin film transistor 16b. In this arrangement, the alignment mark 207 does not cause a decrease in performance of the monocrystalline Si thin film transistor 16b.

Further, the alignment mark 207 of the present embodiment is formed on the same layer, from the same material, and in the same fabrication step as those for the gate electrode 206. Therefore, separate fabrication process for the alignment mark 207 is not necessary, thus simplifying the fabrication and reducing manufacturing cost. Further, the same condition may be used for formation of the alignment mark 207 and formation of the gate electrode 206; accordingly, in the later steps, detection of the gate electrode 206 in accordance with the alignment mark 207 may be carried out with a good accuracy, almost as accurate as detection of the gate electrode 206 itself.

Further, in the present embodiment, the detection of position of the alignment mark 207 is performed by visible light; however, infrared light or UV (ultraviolet) light etc. may also be used.

Further, the present embodiment uses a SiO$_2$ film for the materials of the insulating film 3, the gate insulating film 6, the interlayer insulating film 8, the insulating film 202, the gate insulating film 205 and the interlayer insulating film 210; however, these films may be formed from other materials as long as they are provided with a light-transmissive insulating property, that allows light transmission for detecting the position of the alignment mark 207. However, a SiO$_2$ film or a film mainly containing SiO$_2$ film is commonly used for an insulating film, thus offering easy fabrication and high insulative property.

Further, in the present embodiment, the alignment mark 207 is formed on the element-isolation region of the monocrystalline Si substrate 10b; however, the mark may be provided in any portions allowing detection after the monocrystalline Si substrate 10b is bonded with the insulating substrate 2.

Further, the semiconductor device 20b of the present embodiment and the fabrication method thereof are the same as the semiconductor device 20 of the First Embodiment and the fabrication method thereof, except for the formation method and the structure of the element-isolation region on the monocrystalline Si substrate.

Third Embodiment

Still another embodiment of the present invention is explained below with reference to the figures. FIGS. 5(a) through 5(k) are cross-sectional views illustrating manufacturing steps according to the present embodiment in which a monocrystalline Si substrate 10c is transferred on the insulating substrate 2. FIGS. 6(a) through 6(h) are cross-sectional views illustrating other manufacturing steps of a semiconductor device according to the present embodiment.

In the first and second embodiments, the alignment mark 107 is formed from a polysilicon, which is also used for the gate electrode 106. However, any material allowing detection by light may be used.

The present embodiment explains a semiconductor device including an alignment mark 114 formed from the same metal material as that used for metal leads 113 formed on the monocrystalline Si substrate 10c, and also explains the manufacturing method thereof.

The present embodiment uses a semiconductor device 20c that is the same as the semiconductor device 20 of the first embodiment, except for a monocrystalline Si substrate 10c. This monocrystalline Si substrate 10c includes an alignment mark that is formed from a different material and through a different fabrication method as those for the alignment mark included in the monocrystalline Si substrate 10a. For ease of explanation, materials having the equivalent functions as those shown in the drawings pertaining to the first embodiment above will be given the same reference symbols, and explanation thereof will be omitted here.

Further, though the present embodiment is based on the first embodiment above, it may also be adopted as an alternative of the second embodiment. Specifically, in the structure of the second embodiment, the alignment mark 207 made of polysilicon is replaced to the alignment mark 114 formed from the same metal material as that used for metal leads 113 formed on the monocrystalline Si substrate 10c.

As illustrated in FIG. 6(h), the semiconductor device 20c of the present embodiment includes a non-monocrystalline Si thin film transistor (deposited device) 1a, and a MOS monocrystalline Si thin film transistor (monocrystalline Si thin film device, transferred device) 16c with a monocrystalline Si thin film 14c, and metal leads 13, all of which are formed on an insulating substrate 2.

The MOS monocrystalline Si thin film transistor 16c includes the monocrystalline Si thin film 14c, a SiO$_2$ film 105 as a gate insulating film, a gate electrode 106, an interlayer insulating film (SiO$_2$ film) 110, metal leads 113, and a planarizing film (SiO$_2$ film) 115.

The monocrystalline Si thin film transistor 16c is formed on a monocrystalline Si wafer 100c (see FIG. 5(k)) before it is bonded with the insulating substrate 2. The monocrystalline Si wafer 100c is bonded with the insulating substrate 2 together with a field oxide film 104, the gate electrode 106, the gate insulating film 105, impurity implanted regions 109S and 109D, metal leads 113 and the alignment mark 114, and the planarizing film (SiO$_2$ film) 115. Note that, the alignment mark 114 is formed from the same material as that for the metal leads 113, on a SiO$_2$ layer consisting of the field oxide film 104, the gate insulating film 105, and the interlayer insulating film 110, all of which are made of SiO$_2$ having light-transmissive property.

Here, the following explains a fabrication method of the semiconductor device 20c.

In a fabrication method of the semiconductor device 20c of the present embodiment, a part of the monocrystalline Si thin film transistor (transferred device) 16c including the metal leads 113 is first fabricated on a monocrystalline Si substrate (half-done transferred device) 10c, and then the part of the monocrystalline Si thin film transistor 16c is transferred from the monocrystalline Si substrate 10c onto the insulating substrate 2.

First, a fabrication method of the monocrystalline Si substrate 10c on which a part of the monocrystalline Si thin film transistor 16c is formed is explained with reference to FIGS. 5(a) through 5(k).

The monocrystalline Si substrate 10c is formed on a monocrystalline Si wafer 100c, which is similar to the monocrystalline Si wafer 100 of the first embodiment. The process is described below. Note that, since the steps shown in FIGS. 5(a) through 5(d) are the same as those of FIGS. 1(a) through 1(d), the explanation is omitted.

After the step of FIG. 5(d), the silicon nitride film 103 is removed, and the gate insulating film (SiO$_2$ film) 105 is formed, as shown in FIG. 5(e). These processes may be performed by the similar methods as those of the first embodiment.

Then, by a similar method to that of the first embodiment, the gate electrodes 106 is patterned (patterning of the gate electrode is performed) in the element-formed region. Unlike the first embodiment, the process does not form the alignment mark 107.

Then, as shown in FIG. 5(f), heat processing is carried out by a similar method to that of the first embodiment, so as to recover the damage of the crystal of the silicon after implantation of impurities and activate the impurities as a donor (an impurity for producing n-type semiconductor) or an acceptor (an impurity for producing p-type semiconductor).

Next, as shown in FIG. 5(g), an interlayer insulating film 110 is formed by a similar method to that of the first embodiment, i.e., by a thermal CVD method etc.

In the next step, as with the first embodiment, hydrogen ion implantation is carried out onto the monocrystalline Si wafer 100c to form a hydrogen ion implanted region 111, as shown in FIG. 5(h).

Next, as shown in FIG. 5(i), a contact hole is formed on the interlayer insulating film 110.

Then, a metal film of 100 nm to 500 nm thick is formed through sputtering (not shown) for later fabrication of the metal leads 113 and the alignment mark 114. It is preferable that this metal material is resistant to heat processing performed after the transfer step. Suitable examples may be titanium or titanium nitride, but an alloy mainly containing aluminum with improved heat resistance is also allowable.

Then, by photolithography, the metal film so formed is patterned into the shape of the metal leads 113 and the alignment mark 114, as shown in FIG. 5(j). Specifically, the metal leads 113 and the alignment mark 114 are formed by patterning the metal film in the steps of applying (patterning), exposing, and developing a photoresist, followed by silicon etching and removal of the photoresist. Note that, the metal leads 113 are formed in the element-formed region or by extending from the element-formed region to the field section, and the marker 114 is formed in the field section.

Then, as shown in FIG. 5(k), a SiO$_2$ film 115 of about 600 nm thick is deposited as the interlayer insulating film using a mixture of TEOS gas and 02 (oxygen) gas. Then, by a CMP (Chemical Mechanical Polishing) method etc., the wafer surface (the surface of the interlayer insulating film 115) is planarized. Here, the interlayer insulating film 115 is planarized to not more than 0.1 nm in a Ra value.

Further, the monocrystalline silicon wafer 100c with a surface including a part of the monocrystalline thin film transistor 16c is then cut into individual monocrystalline Si substrates 10c of a required size (the cutting process is not illustrated).

Referring to FIGS. 6(a) through FIG. 6(h), description is made further as to how the semiconductor device 20c is fabricated.

First, the insulating substrate 2 is cleaned without disturbing its surface. In the present embodiment, the insulating substrate (insulative-substrate) 2 is made of a high-strain-point (approximately 600° C.) glass ("code 1737", a product of Corning) (alkali-earth alumino-boro-sillicated glass) of about 0.7 mm thick.

Then, a $SiO_2$ film 3 of about 100 nm thick is deposited over the entire surface of the insulating substrate 2 by a plasma CVD method, as shown in FIG. 6(a). Specifically, a mixture gas of TEOS (Tetra Ethyl Ortho-Silicate) and $O_2$ is flown onto the entire surface of the insulating substrate 2 under reduced pressures of about 100 Pa to about 200 Pa and at a temperature of about 300° C., and a $SiO_2$ film etc. of about 100 nm thick is formed on the substrate by plasma discharge.

Then, as shown in FIG. 6(b), after activating the insulating substrate 2 and the monocrystalline Si substrate 10c with a part or the whole of the transferred device by SC1 cleaning, the monocrystalline Si substrate 10c on the side of the hydrogen ion implanted region 111 is aligned on a predetermined position so as to be bonded in contact with the insulating substrate 2 at room temperature.

The surface cleanness and activity of the insulating substrate 2 (light-transmissive amorphous substrate (with the $SiO_2$ coating film)) and the monocrystalline Si substrate 10c (transferred device substrate with the oxidized surface) become very important when these two substrates are to be bonded together without an adhesive. For this reason, the insulating substrate 2 and the monocrystalline Si substrate 10c are cleaned with a liquid called "SC1" and are dried before bonded.

In the next step, as shown in FIG. 6(c), the $SiO_2$ film 4 of about 200 nm thick and an amorphous Si film 5 of about 50 nm thick are formed over the entire surface of the insulating substrate 2. These films are both deposited by plasma CVD method (plasma chemical vapor deposition method). More specifically, the $SiO_2$ film 4 is deposited by flowing a mixture gas of TEOS (Tetra Ethyl Ortho-Silicate) and $O_2$ under reduced pressures of about 100 Pa to about 200 Pa and at a temperature of about 300° C. under plasma discharge. Meanwhile, the amorphous Si film 5 is deposited by flowing monosilane gas and hydrogen gas at a temperature of about 250° C. under plasma discharge.

Next, as shown in FIG. 6(d), a part of the monocrystalline Si substrate 10c is cleaved and divided through heat treatment of about 450° C. to 600° C. This heat treatment plays the roles of dehydrogenation process of the amorphous Si film 5 and detaching process of the monocrystalline Si substrate 10c with a part or the whole of the transferred device from the hydrogen ion implanted region 111. As a result, there is created a substrate containing both a part of the monocrystalline Si thin film transistor 16c (transferred monocrystalline Si device) and a non-monocrystalline semiconductor film (amorphous Si film 5) that is deposited on the insulating-substrate 2.

Next, the semiconductor film (amorphous Si film 5) deposited on the insulating substrate 2 is modified from an amorphous (amorphous Si film 5) to polycrystalline state (polycrystalline Si film (polycrystalline Si film, non-monocrystalline Si thin film) 5') by the polycrystallization using an energy beam. Namely, by irradiation of an excimer laser, the amorphous Si thin film 5 is heated and crystallized to grow a non-monocrystalline Si layer and thereby form the non-monocrystalline Si thin film 5'. Note that, the polycrystallization may be performed by an SLS (Sequential Lateral solidification: SLS) method. In this way, the amorphous Si film 5 is modified to a polycrystalline Si film 5' on the substrate containing both a part of the monocrystalline Si thin film transistor 16c (monocrystalline Si device) and a semiconductor film that is deposited on the insulating substrate 2.

Then, as shown in FIG. 6(e), in order to provide portions for the active region of the device, unwanted portions of the polycrystalline Si film 5' are removed to obtain a discrete pattern in the non-monocrystalline Si film 5'. The pattern of the polycrystalline Si film 5' becomes the semiconductor layer of the non-monocrystalline Si thin film transistor 1a.

Further, again referring to FIG. 6(e), dry etching is carried out with respect to a part of the monocrystalline Si thin film transistor 16c bonded with the insulating substrate 2 to reduce its thickness, thereby forming a thin film of a monocrystalline Si thin film 14c. Further, wet light etching for removing damages, and defect recovering heat treatment (defect recovering annealing) are sequentially carried out.

Then, as shown in FIG. 6(f), a SiO2 film 6 of appropriately 60 nm thick is formed by plasma CVD using a mixture of SiH4 gas and N2O gas. This SiO2 film 6 functions as the gate insulating film of the non-monocrystalline Si thin film transistor 1a. Further, a gate electrode 7 of the non-monocrystalline Si thin film transistor 1a is formed on the SiO2 film 6.

Further, as shown in FIG. 6(g), a $SiO_2$ film 8 of appropriately 350 nm thick is formed by a P-CVD using a mixture of TEOS and $O_2$ (oxygen). This $SiO_2$ film 8 functions as an interlayer planarizing insulating film. Further, the alignment mark 114 in the monocrystalline Si device region is detected through the $SiO_2$ films 8, 6, 104 and 110 for positioning (alignment), before forming a resist pattern (not shown). Then, a contact hole 11 and an alignment mark (marker) 12 are formed on the $SiO_2$ films 8, 6, 104 and 110. In this way, the respective layers to be provided with metal leads 13 are properly positioned, before patterned.

Next, a metal layer (not shown) is provided in a predetermined area of the $SiO_2$ film 8 and the contact hole 11. Then, a resist pattern (not shown) is formed according to the alignment mark 12, and the metal layer is etched. As a result, metal leads 13 are obtained as shown in FIG. 6(h). In this manner, the monocrystalline Si thin film transistor 16c and the non-monocrystalline Si thin film transistor 1a are formed on the insulating substrate 2.

As described, according to the fabrication method of a semiconductor device of the present embodiment, an alignment mark 114 is formed on the monocrystalline Si substrate 10c, and, further, the interlayer insulating film 110, a field oxide film ($SiO_2$ film) 104 created through LOCOS oxidization, the gate insulating film ($SiO_2$ film) 6, and an interlayer insulating film ($SiO_2$ film) 8 are formed on the alignment mark 114. In other words, a $SiO_2$ layer is formed on the alignment mark 114. In this arrangement, the layer between the alignment mark 114 and the monocrystalline Si substrate 10c bonded with the insulating substrate 2 has a light-transmissive property.

This arrangement allows proper and easy alignment of a mask after the transfer process. Namely, in the transistor forming step after the transfer process, the alignment of components may be securely and accurately performed based on the gate electrode of the transferred device.

Further, in the present embodiment, the alignment mark 114 is formed on the element-isolation region of the monocrystalline Si thin film transistor 16c. In this arrangement, the alignment mark 114 does not cause a decrease in performance of the monocrystalline Si thin film transistor 16c.

Further, in the fabrication method of the semiconductor device according to the present embodiment, the monocrystalline Si substrate 10c is formed before the polycrystal Si thin film (non-monocrystalline Si thin film) 5' is formed. This allows the monocrystalline Si substrate 10c to be transferred onto a flat surface of the insulating substrate 2 and therefore prevent the problem of contact failure, etc.

For the insulation substrate 2 of the present invention, other material than the "code 1737", a product of Corning (alkali-earth alumino-boro-sillicated glass) may be used.

Further, the semiconductor device 20c of the present embodiment is formed on an active matrix substrate; however, the semiconductor device 20 may be used for many other purposes.

Further, the transferred device to be transferred to the insulating substrate 2 is not limited to the monocrystalline Si thin film transistor 16c described in the explanation of the present embodiment.

Further, the transferred device to be transferred to the insulating substrate 2 is not limited to the monocrystalline Si substrate 10c including the monocrystalline Si thin film transistor 16c. For example, a substrate including a part of the transferred device may be transferred to the insulating substrate 2, and the rest of components may be formed thereafter. However, it should be noted that the micro-fabrication of the device, such as formation of gate electrode, implantation of impurities, or formation of one or more metal leads layer, is preferably carried out before the transfer.

Further, though the present embodiment describes a case where the monocrystalline Si wafer 100c includes a single layer of metal leads 113, the metal leads 113 may also be provided as multiple layers. In this case, the marker may be formed in one of the fabrication steps of the plural metal leads layers.

Further, the alignment mark 114 of the present embodiment is formed on the same layer, from the same material, and in the same fabrication step as those for the metal leads 113. Therefore, separate fabrication process for the alignment mark 114 is not necessary, thus simplifying the fabrication and reducing manufacturing cost. Further, the same condition may be used for formation of the alignment mark 114 and formation of the metal leads 113; accordingly, in the later steps, detection of the metal leads 113 in accordance with the alignment mark 114 may be carried out with a good accuracy, almost as accurate as detection of the metal leads 113 itself.

Further, in the present embodiment, the detection of position of the alignment mark 114 is performed by visible light; however, infrared light or UV (ultraviolet) light etc. may also be used.

Further, the present embodiment uses a $SiO_2$ film for the materials of the insulating film 3, the gate insulating film 6, the interlayer insulating film 8, the field oxide film 107, the interlayer insulating film 110, and the planarizing film 115; however, these films may be formed from other materials as long as they are provided with a light-transmissive insulating property, that allows light transmission for detecting the position of the alignment mark 114. However, a $SiO_2$ film or a film mainly containing $SiO_2$ film is commonly used for an insulating film, thus offering easy fabrication and high insulative property.

Further, in the present embodiment, the gate electrode 106 of the monocrystalline Si thin film transistor is formed in. a portion closer to the insulating substrate 2 than the monocrystalline Si thin film transistor 14c after the transfer. This allows easy processing of, such as etching, metal leads etc. of the monocrystalline Si thin film transistor 14c after the transfer.

Further, in the present embodiment, the monocrystalline Si substrate 10c is provided with a hydrogen ion implanted region (a layer containing hydrogen ion or hydrogen ion and rare gas) before bonded with the insulating substrate 2, and after the bonding, a part of the monocrystalline Si substrate 10c is detached from the hydrogen ion implanted region by heat treatment. However, the part of the monocrystalline Si substrate 10c may be removed by some other ways.

Further, in the present embodiment, the alignment mark 114 is formed on the element-isolation region of the monocrystalline Si substrate 10c; however, the mark may be provided in any portions allowing detection after the monocrystalline Si substrate 10c is bonded with the insulating substrate 2.

Fourth Embodiment

Yet another embodiment of the present invention is explained below with reference to the figures. FIGS. 7(a) through 7(h) are cross-sectional views illustrating fabrication steps of a semiconductor device 20d according to the present embodiment.

In the first through third embodiments above, the alignment marks 107, 207, 114 are used for positioning in forming the semiconductor device having been through the bonding process; however, the use of the alignment mark is not limited to this. For example, the respective alignment marks 107, 207, 114 may be used for positioning in the bonding process.

The present embodiment describes the alignment mark 107 in use for positioning in the bonding process, with description of the semiconductor device subjected to such a process and the fabrication method thereof.

The present embodiment uses a semiconductor device 20d that is the same as the semiconductor devices of the respective embodiments above, except for its bonding process and the subsequent forming process on the insulating substrate. Thus, for ease of explanation, materials having the equivalent functions as those shown in the drawings pertaining to the first embodiment above will be given the same reference symbols, and explanation thereof will be omitted here.

Further, though the present embodiment is based on the first embodiment above, it may also be adopted as an alternative of the second or the third embodiment. Specifically, the bonding process of the second or the third embodiment may be performed with positioning according to the alignment mark 207 or 114.

As illustrated in FIG. 7(h), a semiconductor device 20d of the present embodiment includes a $SiO_2$ (silicon oxide) film (oxidized film) 3, a MOS non-monocrystalline Si thin film transistor (deposited device) 1a with a polycrystalline Si thin film 5' (non-monocrystalline Si thin film 5'), a MOS monocrystalline Si thin film transistor (monocrystalline Si thin film device, transferred device) 16a with a monocrystalline Si thin film (active layer) 14a, and metal leads 13, all of which are formed on an insulating substrate 2.

Referring to FIGS. 7(a) through FIG. 7(h), description is made further as to how the semiconductor device 20d is fabricated. The fabrication method of the monocrystalline Si substrate 10a used in the present embodiment is the same as that of the first embodiment, and therefore the explanation is omitted here.

First, the insulating substrate 2 is cleaned without disturbing its surface. In the present embodiment, the insulating substrate (insulative-substrate) 2 is made of a high-strainpoint (approximately 600° C.) glass ("code 1737", a product of Corning) (alkali-earth alumino-boro-sillicated glass) of about 0.7 mm thick.

Then, a SiO$_2$ film 3 of about 100 nm to 500 nm thick is deposited over the entire surface of the insulating substrate 2 by a plasma CVD method, as shown in FIG. 7(a). Specifically, a mixture gas of TEOS (Tetra Ethyl Ortho-Silicate) and Oxygen gas is flown onto the entire surface of the insulating substrate 2 under reduced pressures of about 100 Pa to about 200 Pa and at a temperature of about 300° C., and a SiO$_2$ film etc. of about 100 nm to 500 nm thick is formed on the substrate by plasma discharge.

Next, the mark is formed by patterning a resist into a desired shape by photolithography, followed by etching of the insulating film. As a result, a bonding mark (third marker) 116 is formed on the insulating substrate 2.

Then, as shown in FIG. 7(b), after activating the insulating substrate 2 and the monocrystalline Si substrate 10a with a part or the whole of the transferred device by SC1 cleaning, the monocrystalline Si substrate 10a on the side of the hydrogen ion implanted region 111 is aligned on a predetermined position so as to be bonded in contact with the insulating substrate 2 at room temperature. Here, alignment accuracy in bonding may be increased using the alignment mark 107 formed on the monocrystalline Si substrate 10a, for example, by optically detecting the overlaid position of the alignment mark 107 with the bonding mark 116 (relation in position between the alignment mark 107 and the bonding mark 116). In this way, the insulating substrate 2 and the monocrystalline Si substrate 10a may be bonded with a superior accuracy even when the cutting of the monocrystalline Si substrate 10a is varied in position or size of the resulting piece. Further, the notable point of the present embodiment is that the optical detection of the alignment mark 107 formed on the monocrystalline Si substrate 10a may be performed from both the front and rear surface of the monocrystalline Si substrate 10d, and the overlaying position of the alignment mark 107 and the bonding mark 116 may also be detected. In this way, accuracy of the bonding position can be significantly increased, while significantly enlarging designing range of the bonding device.

The rest of the processes are the same as those in the first embodiment, and the explanation is omitted.

With the structure of the present embodiment, the bonding of the monocrystalline Si substrate 10a and the insulating substrate 2 may be performed with a superior accuracy in accordance with a pattern previously formed on the insulating substrate. Further, after the transfer step, the mask alignment can be easily carried out with high accuracy.

The present embodiment only describes the bonding mark 116 that is previously formed on the insulating substrate 2; however, the present invention is not limited to this, but may use the alignment 107 in the bonding step after a part or the whole of the non-monocrystalline Si thin film transistor 1a.

Further, in the present embodiment, the alignment in bonding is carried out by overlaying the respective patterns/marks of insulating substrate 2 and the monocrystalline Si substrate 10a; however, the present invention is not limited to this method. For example, the alignment may be performed in such a way that the respective patterns/marks are overlaid with each other to find the relative positions of the two substrates and then the substrates are carefully shifted to be bonded at the accurate desired position. In this way, it is possible to ensure flatness of the area for the transferred device.

Further, in the present embodiment, the bonding mark 116 is formed by patterning the SiO2 film 3; however, it may be formed in the other fabrication process or on the other layers as long as the resulting mark can be used for the positioning in the bonding step.

The present invention is not limited to the embodiments above, but may be altered within the scope of the claims. An embodiment based on a proper combination of technical means disclosed in different embodiments is encompassed in the technical scope of the present invention.

Further, the enforcement of the present invention is not limited to the described embodiments; for example, the method for forming the non-monocrystalline Si, the material of the interlayer insulating film, the film thickness etc. may be obtained by other means that a person in the art can think of. Further, the present invention allows the use of different material if it is to be used for the same kind of purposes.

Further, the foregoing semiconductor device formed from a monocrystalline Si or a non-monocrystalline Si is not limited to a MOS transistor, but may be a bipolar transistor, a SIT (Static Induction Transistor), or a diode, for example. Further, the transferred device transferred on the insulating substrate may differ from the deposited device deposited on the insulating substrate. Rather, it is one of the advantages of the present invention that those devices may be unified on a single glass substrate. The advantage becomes particularly effective for a system LSI realizing plural high tasks, or a high-function LSI with improved performance using a SOI.

A semiconductor device according to the present invention includes a first device and a second device that are both provided on an insulating substrate wherein the first device is a transferred layer that has been transferred onto the insulating substrate at least with an active layer, a gate insulating film and a gate electrode that are previously formed thereon, and the second device is formed on the insulating substrate by being deposited thereon, wherein: the transferred layer includes (a) a marker whose position is detectable by light and (b) a light-transmissive insulating film formed on an opposite side to a side of the insulating substrate with respect to the marker.

Here, the light-transmissive insulating film is an insulating film having a light-transmissive property with respect to the light for detecting the marker. Further, the active layer is a semiconductor layer including source, drain, a channel area etc., and has no light-transmissive property.

With the foregoing arrangement, a film formed on an opposite side to a side of the insulating substrate with respect to the marker is made of a light-transmissive insulating film. Therefore, the position of the marker is detectable by light from an opposite side of the semiconductor device to a side facing the insulating substrate.

By thus detecting the position of the marker, alignment of the components in accordance with the transferred layer may be securely performed. Namely, the alignment may be accurately and properly performed in accordance with the marker.

Therefore, in the semiconductor device fabrication step, the fabrication of the metal leads etc. after the transfer step may be performed with accurate and secure alignment. On this account, the misalignment of the metal leads etc. may be securely prevented, thereby realizing a highly-reliable semiconductor device.

Further, for example, the marker may be used for alignment on mounting the semiconductor device of the present invention to other substrate (e.g. an active matrix substrate of a liquid crystal display device), that allows secure mounting thereof with accurate alignment.

Further, the semiconductor device of the present invention may be arranged so that: the marker is formed on an element-isolation region in the transferred layer of the first device.

With this arrangement, the marker may be securely insulated from the transferred device. Therefore, it is possible to securely protect the transferred device from influence of the marker, thus ensuring its performance.

The foregoing semiconductor device may be arranged so that: the element-isolation region is made up of light-transmissive insulating films locally provided, and the marker is formed on at least one of the light-transmissive insulating films.

Otherwise, the semiconductor device may be arranged so that: the element-isolation region is made up of shallow trenches, each of which has a light-transmissive insulating film buried therein, and the marker is formed on the light-transmissive insulating film.

With this arrangement in the element-isolation region, it is possible to ensure element isolation of the transferred device, and also to ensure insulation between the marker and the transferred device. Further, in this structure, the element isolation and formation of the area of the marker may be performed with a single fabrication step. Thus, for example, a separate etching process of the active layer for element isolation may be omitted, thereby simplifying the manufacturing process.

Further, the semiconductor device of the present invention may be arranged so that: the light-transmissive insulating film is a $SiO_2$ film or a film mainly containing a $SiO_2$ film.

With this arrangement, it is possible to easily form a reliable insulating film.

The semiconductor device according to the present invention may be arranged so that: the marker is formed on a same layer of the first device as a layer having the gate electrode, from a same material as the gate electrode.

With this arrangement, the same condition may be used for formation of the marker and formation of the gate electrode; accordingly, detection of the gate electrode may be carried out with a good accuracy in accordance with the marker, almost as accurate as detection of the gate electrode itself. Further, the marker and the gate electrode may be formed with a single fabrication step. Thus, a separate marker forming step may be omitted, thereby simplifying the manufacturing process.

Further, the semiconductor device according to the present invention may be arranged so that: the transferred layer includes metal leads, and the marker is formed on a same layer of the first device as a layer having the metal leads, from a same material as the metal leads. With this arrangement, the same condition may be used for formation of the marker and formation of the metal leads; accordingly, detection of the metal leads may be carried out with a good accuracy in accordance with the marker, almost as accurate as detection of the gate electrode itself. Further, the marker and the metal leads may be formed with a single fabrication step. Thus, a separate marker forming step may be omitted, thereby simplifying the manufacturing process.

Furthermore, with this arrangement using the marker formed from a metal material easily detectable by light, positioning accuracy may be improved.

Further, the foregoing transferred device (first device) may be a monocrystalline Si thin film transistor.

With this arrangement, a high-performance and multifunctional semiconductor device can be realized less expensively than forming all the transistors from the monocrystalline Si thin film alone on the insulating substrate.

A fabrication method according to the present invention is employed to create a semiconductor device including a first device and a second device that are both provided on an insulating substrate wherein the first device is a transferred substrate that has been transferred onto the insulating substrate at least with an active layer, a gate insulating film and a gate electrode that are previously formed thereon, and the second device is formed on the insulating substrate by being deposited thereon, said method comprising the step of: (a) bonding the transferred substrate with the insulating substrate; (b) detaching a part of the transferred substrate after the step (a); and (c) forming a marker detectable by light before the step (a) on the transferred substrate on a portion allowing detection by light, that is performed after the step (b) from an opposite side of the transferred substrate to a side facing the insulating substrate, the marker being used for alignment in semiconductor device forming steps that are performed after the step (a).

With the foregoing arrangement, alignment of the components in accordance with the transferred layer in the fabrication steps after the bonding step may be securely performed in accordance with the detection result of the marker. Namely, the alignment may be accurately and properly performed in accordance with the marker. On this account, the misalignment of the metal leads etc. may be securely prevented, thereby realizing a highly-reliable semiconductor device.

The foregoing fabrication method of a semiconductor device may be arranged so that: in the step (c), the marker is formed on an element-isolation region of the transferred device (first device).

With this arrangement, the marker may be securely insulated from the transferred device. Therefore, it is possible to securely protect the transferred device from influence of the marker, thus ensuring its performance.

The foregoing fabrication method of a semiconductor device may be performed by (d) locally providing light-transmissive insulating films in the element-isolation region; in this case, in the step (c), the marker is formed on at least one of the light-transmissive insulating films.

The foregoing-fabrication method may be arranged so that: element isolation is realized by (d) forming shallow trenches in the element-isolation region; and (e) burying a light-transmissive insulating film in each of the shallow trenches.

Note that, when the element isolation is realized in the foregoing manner, the marker is preferably formed on the light-transmissive insulating films formed on the element-isolation region. With this arrangement, it is possible to ensure element isolation of the transferred device, and also to ensure insulation between the marker and the transferred device.

Further, the fabrication method of a semiconductor device further comprises the step of: (d) forming at least one interlayer insulating film made of a light-transmissive insulating film on a surface of the active layer after the active layer is exposed in a surface of a remaining part of the transferred substrate left on the insulating substrate.

With this arrangement, since the interlayer insulating film is formed from a light-transmissive insulating film, the marker can still be detected through the interlayer insulating film. Further, since fabrication steps are thereafter carried out in accordance with detection result of the marker, the alignment by the marker may be accurately and properly performed.

Further, the foregoing fabrication method may include the step of (e) forming a second marker on the interlayer insulating film in accordance with the marker, the second marker being used for alignment in semiconductor device forming steps that are performed after the step (e).

This arrangement also allows accurate and proper alignment by the marker that is formed from the same material as that for the gate electrode or the metal leads.

Further, the marker may be used for alignment in the step (a). Also, the fabrication method may further comprise the step of: (d) forming a third marker on the interlayer insulating film, the third marker being used for alignment in the step (a) with the marker. In this case, the alignment may also be performed in accordance with the pattern formed on the insulating substrate. In this manner, the all patterns formed in the fabrication process, including the transferred layer, may be securely provided on the right positions.

Further, since the position of the marker is detectable by light from an opposite side of the transferred substrate to a side facing the insulating substrate, the condition of the marker in alignment can be easily detected, thereby accurately and properly performing the alignment.

Further, the transmissive-insulating film may be formed from a $SiO_2$ film or a film mainly containing a $SiO_2$ film. In this case, a highly-insulative film is easily fabricated.

Further, the marker may be formed on a layer having the gate electrode, from a same material as the gate electrode. With this arrangement, a separate marker forming step may be omitted, thereby reducing manufacturing cost. Further, the same condition may be used for formation of the marker and formation of the gate electrode; accordingly, detection of the gate electrode may be carried out with a good accuracy in accordance with the marker, almost as accurate as detection of the gate electrode itself.

Further, the marker and metal leads may be formed before the step (a) on the transferred substrate on a same layer from a same material. With this arrangement, a separate marker forming step may be omitted, thereby reducing manufacturing cost. Further, the same condition may be used for formation of the marker and formation of the metal leads; accordingly, detection of the metal leads may be carried out with a good accuracy in accordance with the marker, almost as accurate as detection of the metal leads themselves.

Further, the foregoing fabrication method of a semiconductor device may perform implantation of hydrogen ion, or hydrogen ion and a rare gas to the transferred substrate so as to form a hydrogen ion implanted region, before the step (a); and the step (b) may be performed by detaching a part of the transferred substrate from the hydrogen ion implanted region through heat treatment.

Further, the transferred device (first device) may be a monocrystalline Si thin film transistor.

With this arrangement, a high-performance and multifunctional semiconductor device can be realized less expensively than forming all the transistors from the monocrystalline Si thin film alone on the insulating substrate.

The present invention may be suitably adopted for a semiconductor device with plural kinds of transistors of different characteristics formed on a single substrate. For example, for a TFT-driven active matrix liquid crystal display device including a semiconductor device in which a peripheral driving circuit and a control circuit are formed on a single substrate, the present invention offers improvement in performance of the circuits.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A semiconductor device comprising:
   a first device and a second device that are both provided on an insulating substrate wherein the first device is a transferred layer that has been transferred onto the insulating substrate at least with an active layer, a gate insulating film and a gate electrode that are previously formed thereon, and the second device is formed on the insulating substrate by being deposited thereon,
   wherein the gate electrode is formed to be closer to the insulating substrate than the active layer, and the transferred layer includes (a) a marker whose position is detectable by light and (b) a light-transmissive insulating film formed on an opposite side to a side of the insulating substrate with respect to the marker, wherein the marker is formed on a same layer of the first device as a layer having the gate electrode, from a same material as the gate electrode.

2. The semiconductor device as set forth in claim 1, wherein the marker is formed on an element-isolation region in the transferred layer of the first device.

3. The semiconductor device as set forth in claim 2, wherein the element-isolation region is made up of light-transmissive insulating films locally provided, and the marker is formed on at least one of the light-transmissive insulating films.

4. The semiconductor device as set forth in claim 2, wherein the element-isolation region is made up of shallow trenches, each of which has a light-transmissive insulating film buried therein, and the marker is formed on the light-transmissive insulating film.

5. The semiconductor device as set forth in claim 1, wherein the light-transmissive insulating film is a SiO2 film or a film mainly containing a SiO2 film.

6. The semiconductor device as set forth in claim 1, wherein the transferred layer includes metal leads, and the marker is formed on a same layer of the first device as a layer having the metal leads, from a same material as the metal leads.

7. The semiconductor device as set forth in claim 1, wherein the first device is a monocrystalline Si thin film transistor.

8. A semiconductor device comprising:
   a first device and a second device that are both provided on an insulating substrate wherein the first device is a transferred layer that has been transferred onto the insulating substrate at least with an active layer, a gate insulating film and a gate electrode that are previously formed thereon, and the second device is formed on the insulating substrate by being deposited thereon,
   wherein the gate electrode is formed to be closer to the insulating substrate than the active layer, and the transferred layer includes (a) a marker whose position is detectable by light and (b) a light-transmissive insulating film formed on an opposite side to a side of the insulating substrate with respect to the marker, wherein the transferred layer includes metal leads, and the marker is formed on a same layer of the first device as a layer having the metal leads, from a same material as the metal leads.

9. The semiconductor device as set forth in claim 8, wherein the marker is formed on an element-isolation region in the transferred layer of the first device.

10. The semiconductor device as set forth in claim 9, wherein the element-isolation region is made up of light-transmissive insulating films locally provided, and the marker is formed on at least one of the light-transmissive insulating films.

11. The semiconductor device as set forth in claim 9, wherein the element-isolation region is made up of shallow trenches, each of which has a light-transmissive insulating film buried therein, and the marker is formed on the light-transmissive insulating film.

12. The semiconductor device as set forth in claim 8, wherein the light-transmissive insulating film is a SiO2 film or a film mainly containing a SiO2 film.

13. The semiconductor device as set forth in claim 8, wherein the first device is a monocrystalline Si thin film transistor.

14. The semiconductor device as set forth in claim 13, wherein the first device comprises a monocrystalline Si thin film transistor and the second device comprises a non-monocrystalline Si thin film transistor, wherein the monocrystalline thin Si film transistor and the non-monocrystalline Si thin film transistor use different active layers.

15. The semiconductor device as set forth in claim 7, wherein the first device comprises a monocrystalline Si thin film transistor and the second device comprises a non-monocrystalline Si thin film transistor, wherein the monocrystalline thin Si film transistor and the non-monocrystalline Si thin film transistor use different active layers.

* * * * *